United States Patent
Suzuki et al.

(10) Patent No.: US 7,974,328 B2
(45) Date of Patent: Jul. 5, 2011

(54) SURFACE-EMISSION TYPE SEMICONDUCTOR LASER

(75) Inventors: Naofumi Suzuki, Tokyo (JP); Masayoshi Tsuji, Tokyo (JP); Takayoshi Anan, Tokyo (JP); Kenichiro Yashiki, Tokyo (JP); Hiroshi Hatakeyama, Tokyo (JP); Kimiyoshi Fukatsu, Tokyo (JP); Takeshi Akagawa, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 12/531,326

(22) PCT Filed: Mar. 14, 2008

(86) PCT No.: PCT/JP2008/054703
§ 371 (c)(1),
(2), (4) Date: Sep. 15, 2009

(87) PCT Pub. No.: WO2008/114707
PCT Pub. Date: Sep. 25, 2008

(65) Prior Publication Data
US 2010/0034233 A1   Feb. 11, 2010

(30) Foreign Application Priority Data

Mar. 22, 2007  (JP) ................................ 2007-074881

(51) Int. Cl.
*H01S 5/00* (2006.01)
(52) U.S. Cl. .............. 372/50.124; 372/50.11; 372/45.01
(58) Field of Classification Search ............. 372/50.124, 372/50.11, 45.01
See application file for complete search history.

(56) References Cited

U.S. PATENT DOCUMENTS

| 5,621,750 A  *  | 4/1997 | Iwano et al. .................. 372/96 |
| 2006/0171437 A1* | 8/2006 | Takahashi ................ 372/50.124 |

FOREIGN PATENT DOCUMENTS

| JP | 4-137687 A | 5/1992 |
| JP | 4-340288 A | 11/1992 |
| JP | 7-193325 A | 7/1995 |
| JP | 9-246668 A | 9/1997 |

(Continued)

OTHER PUBLICATIONS

International Search Report for PCT/JP2008/054703 mailed May 20, 2008.

(Continued)

*Primary Examiner* — Kinam Park

(57) ABSTRACT

The present invention provides a surface-emission type semiconductor laser wherein an effective length of a cavity is reduced, thereby enabling to realize a higher-speed direct modulation. In the surface-emission type semiconductor laser according to the present invention, when supposing the optical path length (L) of a resonator part relative to a lasing wavelength $\lambda_0$ to be given as $0.9 \times \lambda_0 \leq L \leq 1.1 \times \lambda_0$, and denoting the refractive indexes of a high refractive index layer and a low refractive index layer of a dielectric DBR by $n_{H1}$ and $n_{L1}$; the average refractive index within an optical path length $\lambda_0/4$ in the semiconductor in contact with the dielectric DBR by $n_{S1}$; and the refractive indexes of the high refractive index layer and the low refractive index layer of a semiconductor DBR by $n_{H2}$ and $n_{L2}$, respective materials to be used are selected so as to satisfy the following conditions (1) and (2):

$$n_{H1} > f(n_{S1})n_{L1}^2 + g(n_{S1})n_{L1} + h(n_{S1}), \quad (1)$$

where $f(n_{S1}) = 0.0266\ n_{S1}^2 - 0.2407\ n_{S1} + 0.6347$; $g(n_{S1}) = -0.0508\ n_{S1}^2 + 0.4335\ n_{S1} - 0.0085$; and $h(n_{S1}) = 0.0382\ n_{S1}^2 - 0.3194\ n_{S1} + 0.7398$, and $$n_{H2} - n_{L2} > 0.4. \quad (2)$$

16 Claims, 5 Drawing Sheets

FOREIGN PATENT DOCUMENTS

| | | |
|---|---|---|
| JP | 10-256665 A | 9/1998 |
| JP | 2004207380 A | 7/2004 |
| JP | 2004535058 A | 11/2004 |
| JP | 2005223351 A | 8/2005 |
| JP | 2006222196 A | 8/2006 |
| JP | 2006253635 A | 9/2006 |
| JP | 2006351798 A | 12/2006 |

OTHER PUBLICATIONS

D. I. Babic; et al., "Analytic Expressions for the Reflection Delay. Penetration Depth, and Absorptance of Quarter-Wave Dielectric Mirrors", IEEE Journal Quantum Electronics, vol. 26, No. 2, p. 514-524, Feb. 1992.

* cited by examiner (a)

(b)

(c)

(d)

(a)

(b)

(c)

(d)

SURFACE-EMISSION TYPE SEMICONDUCTOR LASER

This application is the National Phase of PCT/JP2008/054703, filed Mar. 14, 2008, which claims the priority based on Japanese Patent Application No. 2007-74881 filed on Mar. 22, 2007, of which entirety is incorporated herein by reference.

TECHNICAL FIELD

The present invention relates to a surface-emission type semiconductor laser which is usable as a light source in the fields of optical communications and optical interconnections.

BACKGROUND ART

Optical communications which utilize a semiconductor laser as the light source have an advantage such that they enable long-distance transmission and large-capacity transmission. Especially, long-distance optical communications which utilize a long-wavelength semiconductor laser suitable for low-loss silica optical fibers have been widely used in trunk-line systems of communications, etc. from an early period. In general, in a transmission system for optical communications which employ optical fibers as the transmission path, a semiconductor laser is preferably used as the light source. In such a case, since, in the field of short-distance optical communications, only a relatively small light output is required for the light source to be used therein, a vertical cavity surface emitting semiconductor laser (VCSEL), which has advantages of small size and low power consumption, is applied as the light source for short-distance communications.

Digital signal transmission techniques in which short-distance optical communications that employ optical fibers as the transmission path are used are widely applied in the area of LAN or the like. In particular, their applications to interconnects in very high-speed computers have gained much attention in recent years. In the field of super high-speed computing systems, the continued development of semiconductor micro-processing technologies provides continuously rapid improvement in data processing speed of LSI. Further, an approach has been employed which utilizes parallel processing composed of multiple computing units to improve the overall data processing speed of the system. In a super high-speed computing system, data transfer is conducted between LSI chips mounted on the same board, between boards for mounting those LSI chips, and between housings (nodes) for accommodating multiple boards. The increased data processing speed of LSI itself causes rapid increase in the data traffic volume to be transferred between boards and between housings (nodes) for accommodating multiple boards. On such occasions, improvement in the data transfer speeds between boards and between housings (nodes) for accommodating multiple boards cannot catch up such rapid increases in the data traffic volume to be transferred, which becomes a bottleneck for the improvement in the overall performance of the system.

In the case when a digital signal is transmitted as an electric signal, the loss in a transmission path becomes larger as the frequency increases, and in the case of a high-bit-rate digital signal, distortion takes place in its pulse waveform. Due to this waveform distortion, in an electric signal transmission, the bit-rate at which data can be transmitted without bit errors is limited. Further, since crosstalk takes place between transmission lines which are arranged close to each other, it is difficult to arrange transmission lines at high density. On the other hand, in short-distance optical communications which use optical fibers as the transmission path, since crosstalk between two optical fibers will not take place, it is possible to arrange transmission paths at high density. In addition, the waveform distortion of an optical pulse signal due to phase dispersion caused by the optical fiber itself presents no problem in short-distance optical communications. Therefore, studies are underway on the application of optical interconnections, which enable a high-speed and high-density connection, to the data transfer between boards and between housings (nodes) for accommodating multiple boards.

As the light source to be utilized for optical interconnections, VCSEL which excels in high-density integration, power saving, and cost reduction abilities is viewed as a promising candidate. A VCSEL generally comprises a resonator including an emission region therein, which is sandwiched by semiconductor distributed Bragg reflectors (DBRs), and for high-speed modulation applications, generally a structure in which the optical length of the cavity is set to be one wavelength is used.

For example, Patent Document 1: JP 10-256665 A discloses a structure in which one-wavelength micro-cavity is employed as the resonator comprising an emission region therein, of which the upper and lower ends are sandwiched by semiconductor distributed Bragg reflectors (DBRs), the optical path lengths $L_1$ and $L_2$ from the quantum well layer, which works as the active layer, to the upper and lower ends of the resonator region are selected so as to satisfy the condition: $L_1=L_2=\lambda_0/2$ respectively, as a result, the total optical path length: $L=L_1+L_2=4$. In that case, in the quantum well layer thereof, a high refraction-index layer which has a similar refraction index to that of a GaInNAs layer, which is a higher refraction index layer included in AlAs/GaInNAs composing the semiconductor distributed Bragg reflector (DBR), is used as a layer corresponding to the barrier layer/clad layer, which is formed on each side of a single well layer. Further, such a structure is selected in which an AlAs layer, which is the low refraction-index layer used to compose the semiconductor DBR, is in contact with each side of the quantum well layer.

Further, Patent Document 1 discloses and proposes a structure in which the optical length of the above described cavity is ½ wavelength, which is shorter than usual. This is a structure Which employs a half-wavelength micro-cavity as the resonator including an emission region therein, of which upper and lower ends are sandwiched by semiconductor distributed Bragg reflectors (DBRs), and in which structure the optical path lengths $L_1$ and $L_2$ from the quantum well layer, which works as the active layer, to the upper and lower ends of the resonator region are selected to satisfy $L_1=\lambda_0/4$ and $L_2=\lambda_0/4$ respectively so that the overall optical path length: $L=L_1+L_2=\lambda_0/2$. In the structure, a layer of AlAs is used as the layer corresponding to the barrier layer/clad layer formed on each side of the quantum well layer (active layer), and it exhibits substantially the same refraction index as that of the AlAs layer which is the low refraction-index layer included in the AlAs/GaInNAs composing the semiconductor distributed Bragg reflector (DBR). Moreover, such a structure is employed in which a GaInNAs layer, which is the high refraction-index layer used to compose the semiconductor DBR, is in contact with each side of the micro-cavity.

Further, regarding the dielectric DBR, which is usable as the upper side DBR to form a VCSEL, a calculation method for estimating its effective optical path length, refraction index, internal loss, and the like has been publicly known (Non-Patent Document 1: Dubravko et al., "Analytic Expressions for the Reflection Delay, Penetration Depth, and Absorptance of Quarter-Wave Dielectric Mirrors", J. Quant. Electr. vol. 28, no. 2, p. 514 (1992)).

Patent Document 1: JP 10-256665 A

Non-Patent Document 1: Dubravko et al., "Analytic Expressions for the Reflection Delay, Penetration Depth, and Absorptance of Quarter-Wave Dielectric Mirrors", J. Quant. Electr. vol. 28, no. 2, p. 514 (1992)

DISCLOSURE OF THE INVENTION

Problems to be Solved by the Invention

In order to increase the direct modulation speed in a semiconductor laser, it is effective to reduce the cavity length. For example, in the case of an edge-emission type semiconductor laser, while a semiconductor laser having a cavity length of about 300 μm is used for optical communications at a transmission rate of 2.5 Gbps, in the case if the transmission rate is set at 10 Gbps, a semiconductor laser having a cavity length of about 200 μm is used.

In contrast, in the case of a VCSEL, the cavity length is much shorter in comparison with that of the edge-emission type laser, and is generally several Jim or shorter.

In order that only intended light of a lasing wavelength $\lambda_0$ satisfies the lasing condition, a resonator of the VCSEL is constructed by using two distributed Bragg reflectors (DBRs) which are specifically designed for the lasing wavelength $\lambda_0$. In such a case, the thickness d of the resonator region sandwiched by two distributed Bragg reflectors (DBRs) is selected so as to satisfy the resonance condition for the light of lasing wavelength $\lambda_0$. That is, to satisfy the phase matching condition for the light of lasing wavelength $\lambda_0$, the optical path length (L) of the resonator region is selected to be an integer multiple of ½ of the lasing wavelength $\lambda_0$ as $L=m\times(\lambda_0/2)$. In the structure, generally, the position of the active layer portion to be arranged in the resonator region is selected such that the optical path lengths $L_1$ and $L_2$ from the active layer to the upper and lower ends of the resonator region satisfy the condition: $L_1=m_1\times(\lambda_0/4)$ and $L_2=m_2\times(\lambda_0/4)$ (where $m_1+m_2=2$ m) respectively. This condition corresponds to such selection that the active layer portion is arranged in a high light-intensity portion in the light intensity distribution in the resonator region, that is, in an antinode portion of standing wave.

Since the active layer and its surrounding are generally selected to be composed of a relatively high refraction-index layer, in order to arrange the active layer in the portion of a high light-intensity, that is, an antinode portion of standing wave, it is necessary to set L to be $\lambda$ or longer. That is, m is a natural number of 2 or larger in $L=m\times\lambda/2$, and in the case of a high-speed VCSEL, generally setting is made such that m=2, that is, $L=\lambda$ so that the length of the resonator part is minimized.

For example, as disclosed in Patent Document 1, in a structure in which one-wavelength micro-cavity is employed as the resonator comprising an emission region therein, of which the upper and lower ends are sandwiched by semiconductor distributed Bragg reflectors (DBRs), the optical path lengths $L_1$ and $L_2$ from the quantum well layer, which works as the active layer, to the upper and lower ends of the resonator region are selected so as to satisfy the condition: $L_1=L_2=2\times(\lambda_0/4)$ respectively, as a result, the total optical path length: $L=L_1+L_2=2\times(\lambda_0/2)=\lambda_0$. In that case, in the quantum well layer thereof, a high refraction-index layer which has a similar refraction index to that of a GaInNAs layer, which is a higher refraction index layer included in AlAs/GaInNAs composing the semiconductor distributed Bragg reflector (DBR), is used as a layer corresponding to the barrier layer/clad layer, which is formed on each side of a single well layer. Further, such a structure is selected in which an AlAs layer, which is the low refraction-index layer used to compose the semiconductor DBR, is in contact with each side of the quantum well layer.

In the structure which employs this one-wavelength microcavity, in comparison with the barrier layer/clad layer made up of a GaInNAs layer, the AlAs layers, which are arranged on both sides of the, have a larger band gap energy (i), and thus, the injection of holes and electrons into the well layer is rapidly performed. Therefore, when employing a multiple-quantum-well structure as the active layer, there is substantially no difference in the density of holes and electrons to be injected to each well layer.

As described above, in order to realize the high speed modulation, it is desirable to decrease the cavity length. Thus, Patent Document 1 discloses and proposes a structure in which to realize an arrangement: m=1 in $L=m\times\lambda/2$, that is, $L=\lambda/2$, the active layer is surrounded by low refraction-index layers and further outside thereof, high refraction-index layers are arranged. By selecting this arrangement, L is decreased to shorter than that in a usual structure, thereby attaining improvement in the modulation speed. Specifically, a layer of AlAs is used as the layer corresponding to the barrier layer/clad layer formed on each side of the quantum well layer (active layer), and it exhibits substantially the same refraction index as that of the AlAs layer which is the low refraction-index layer included in the AlAs/GaInNAs composing the semiconductor distributed Bragg reflector (DBR). Moreover, such a structure is employed in which a GaInNAs layer, which is the high refraction-index layer used to compose the semiconductor DBR, is in contact with each side of the micro-cavity.

Thus, by selecting the resonator to be composed a relatively low refraction-index layer, it is made possible to satisfy the phase matching condition and to dispose the active layer in an antinode portion of standing wave even in a structure in which the optical path lengths $L_1$ and $L_2$ are selected so as to satisfy the conditions: $L_1=\lambda_0/4$ and $L_2=\lambda_0/4$ respectively, as a result, the total optical path length: $L=L_1+L_2=\lambda_0/2$.

In a structure which employs the above described half-wavelength micro-cavity, the holes and electrons are to be injected from the GaInNAs layer to the well layer by getting over the barrier layer made of AlAs. On the other hand, the thickness of the barrier layer made of AlAs is set $\frac{1}{4}\times(\lambda_0/n_{AlAs})$ with the refraction index thereof being $n_{AlAs}$. Assuming that $\lambda_0=1.3$ μm and $n_{AlAs}=2.9$, the thickness of the barrier layer made of AlAs will be about 112 nm. In such a case if a multiple-quantum-well layer is used as the active layer, there is possibility that the density of the holes to be injected differs between the well layers. A decrease in differential gain may be resulted therefrom, and the decrease may leads to a relative increase in the rise and fall times of the optical pulse shape when performing a direct modulation operation, which may be a factor limiting the modulation speed. Therefore, active region of a single quantum well type are used in the micro-cavity.

As explained above, with the view of achieving improvement in the high-speed modulation performance, it is desirable to decrease the optical path length L of the resonator part comprised in the VCSEL, and on the other hand, for the purpose of realizing high-speed and high-temperature operations, it is desirable to use a multiple-quantum well as the active layer. However, as explained above, it is extremely difficult to realize both requirements for a half-wavelength cavity length which is shorter than that of a generally used conventional one-wavelength cavity, and for a sufficient injection of carriers into a multiple-quantum well.

Even if both of these requirements could be realized, because of the phase matching condition: $L=m\times(\lambda_0/2)$, it is impossible to reduce the cavity length to shorter than $L=\lambda_0/2$, that is when m=1. In other words, it is impossible to achieve further improvement in the high-speed operation by reducing the cavity length.

The present invention has been made in view of the above described background, and its object is to reduce the effective resonance length of a surface-emission type laser than those of conventional ones to realize a further high-speed operation.

Means for Solving the Problems

The effective cavity length of a VCSEL is not solely dependent on the aforementioned optical path length L of the resonator part sandwiched by the DBRs. Upon reflection of light by the DBR, since a certain amount of light penetrates into the DBR, such light penetration depth into the DBR should be taken in account to estimate the effective cavity length. Denoting the effective optical path length of DBR with the light penetration depth taken into consideration by a symbol $L_{DBReff}$, and the optical path length of said resonator part by a symbol L, as a result of the presence of the DBRs on both sides, the effective optical path length ($L_{eff}$) of the overall resonator for the VCSEL is represented as follows:

$$L_{eff}=L+L_{DBReff1}+L_{DBReff2}$$

Therefore, by decreasing the effective DBR length, it is possible to decrease the effective optical path length of the cavity of VCSEL, thereby increasing the modulation speed.

In the effective optical path length of cavity: $L_{eff}=L+(L_{DBReff2}+L_{DBReff1})$, the optical path length L of the resonator part itself is restricted by the phase matching condition: $L=m\times(\lambda_0/2)$ and is impossible to be further reduced; and thus, the present inventors have searched for a structure which enables to further reduce the component of ($L_{DBReff2}+L_{DBReff1}$).

As a result, the present inventors have found that when constructing a vertical cavity, employing the below described structure in the case when the cavity is formed by using a semiconductor DBR as the substrate side (lower side) DBR, and a dielectric DBR as the opposite side (upper side) DBR enables to reduce the component of ($L_{DBReff2}+L_{DBReff1}$).

At first, the emission region of the VCSEL is to be constructed in such a structure wherein a quantum well structure composed of well layers and barrier layers is employed as the active layer, and on each side thereof a clad layer is provided. Of course, the semiconductor DBR, which is used as the substrate side (lower side) DBR, is arranged so as to be in contact with the lower-side clad layer. The optical path length: $L_2$ from the center of the active layer to the top face of the semiconductor DBR is set about ½ of the lasing wavelength $\lambda_0$.

On the other hand, a dielectric DBR, which is used as the DBR of the light emission surface side (upper side), is arranged so as to be in contact with the upper face of the semiconductor layer that is the uppermost layer of the semiconductor layers composing the resonator region of VCSEL. Regarding the semiconductor that is in contact with the dielectric DBR, let $n_{S1}$ be an average refraction index determined by averaging its refraction index over a range where the optical path length measured from the contact interface is within ¼ of the lasing wavelength $\lambda_0$.

In such a structure, in the case if the optical path length L of the resonator region of the VCSEL is approximately equal to the lasing wavelength $\lambda_0$, that is, $L\approx2\times(\lambda_0/2)$, the optical path length: $L_1$ from the center of the active layer to the lower face of the dielectric DBR will be about ½ of the lasing wavelength $\lambda_0$. In the case when this constitution is selected, it is found that selecting the refraction index: $n_{H1}$ of the high refraction-index layer and the refraction index: $n_{L1}$ of the low refraction-index layer, which layers compose the dielectric DBR, so as to satisfy the below described condition in the relation to the average refraction index: $n_{S1}$ of the semiconductor, which is in contact with the lower face of the dielectric DBR, exhibits a marked effect in reducing the penetration depth: $L_{DBReff1}$ into the upper side DBR (dielectric DBR).

First, the refraction index: $n_{L1}$ of the low refraction-index layer is selected so as to at least satisfy the condition: $n_{S1}>n_{L1}$. In addition, the refraction index: $n_{H1}$ of the high refraction-index layer is selected within a range to satisfy the following condition defined by equation (1).

$$n_{H1}>f(n_{S1})n_{L1}^2+g(n_{S1})n_{L1}+h(n_{S1}) \quad (1)$$

where,
$f(n_{S1})=0.0266 \, n_{S1}^2-0.2407 \, n_{S1}+0.6347$
$g(n_{S1})=-0.0508 \, n_{S1}^2+0.4335 \, n_{S1}-0.0085$
$h(n_{S1})=0.0382 \, n_{S1}^2-0.3194 \, n_{S1}+0.7398$ On the other hand, as for the semiconductor DBR, the refraction index: $n_{H2}$ of the high refraction-index layer and the refraction index: $n_{L2}$ of the low refraction-index layer, which layers compose the semiconductor DBR, are selected so as to at least satisfy the relationship: $n_{H2}, n_{S2}>n_{L2}$ relative to the refraction index: $n_{S2}$ of the semiconductor making up the lower-side clad layer, and the refraction index difference between $n_{H2}$ and $n_{L2}$: $\Delta n=(n_{H2}-n_{L2})$ is selected to be within a range of $(n_{H2}-n_{L2})>0.4$.

Alternatively, in the case if the optical path length L of the resonator region of the VCSEL is approximately equal to 3/2 of the lasing wavelength $\lambda_0$, that is, $L\approx3\times(\lambda_0/2)$, the optical path length: $L_1$ from the center of the active layer to the lower face of the dielectric DBR will be about 2/2 of the lasing wavelength $\lambda_0$. In the case when this constitution is selected, it is found that selecting the refraction index: $n_{H1}$ of the high refraction-index layer and the refraction index: $n_{L1}$ of the low refraction-index layer, which layers compose the dielectric DBR, so as to satisfy the below described condition in the relation to the average refraction index: $n_{S1}$ of the semiconductor, which is in contact with the lower face of the dielectric DBR, exhibits a remarked effect in reducing the penetration depth: $L_{DBReff1}$ into the upper side DBR (dielectric DBR) portion.

First, the refraction index: $n_{L1}$ of the low refraction-index layer is selected to at least satisfy the condition: $n_{S1}>n_{L1}$. In addition, the refraction index: $n_{H1}$ of the high refraction-index layer is selected within a range to satisfy the following condition defined by equation (3).

$$n_{H1}>f(n_{S1})n_{L1}^2+g(n_{S1})n_{L1}+h(n_{S1}) \quad (3)$$

where,
$f(n_{S1})=0.1553 \, n_{S1}^2-1.2429 \, n_{S1}+2.7959$
$g(n_{S1})=-0.2761 \, n_{S1}^2+2.1387 \, n_{S1}-3.5292$
$h(n_{S1})=0.1593 \, n_{S1}^2-1.2113 \, n_{S1}+2.5512$ Further, it is noted that when injecting a current into the active layer of the emission region of this VCSEL via a clad layer provided on each side of the active layer, such a structure may be employed in which the provision of the holes to the p-type clad layer is performed by applying a bias between the p-type electrode that is electrically connected with the p-type clad layer and the n-type electrode that is electrically connected with the n-type clad layer so as to feed a forward direction current. Alternatively, such a structure may be employed in which a $p^+/n^+$-type tunnel junction is provided so as to be in contact with the p-type clad layer, and via this tunnel junction, a tunnel current is fed from the valence band of p⁺ layer to the conduction band of n⁺ layer so that the holes generated in the p⁺ layer are supplied to the p-type clad layer. In this structure to provide holes via the tunnel junction, the driving bias to be applied to the semiconductor laser is applied between a second n-type electrode that is electrically connected with the n-type clad layer and a first n-type electrode that is electrically connected with the n⁺ layer making up the p⁺/n⁺-type tunnel junction.

Based on the findings described so far, the present invention has been completed.

That is, the surface-emission type semiconductor laser of the first embodiment of the present invention is:

a surface-emission type semiconductor laser employing a dielectric distributed Bragg reflector and on an opposite side thereof, a semiconductor distributed Bragg reflector, and comprising a resonator part made up of a semiconductor sandwiched by the dielectric distributed Bragg reflector and the semiconductor distributed Bragg reflector, wherein relative to a lasing wavelength $\lambda_0$ of said surface-emission type semiconductor laser, an optical path length L of said resonator part made up of the semiconductor is selected such that $0.9 \times \lambda_0 \leq L \leq 1.1 \times \lambda_0$; and in relation to a light of lasing wavelength $\lambda_0$, when denoting:

a refraction index of a semiconductor making up a portion of said resonator part made up of the semiconductor, which portion is in contact with the semiconductor distributed Bragg reflector, by a symbol $n_{S2}$;

refraction indexes of a high refraction-index layer and a low refraction-index layer, which compose said semiconductor distributed Bragg reflector, respectively by symbols $n_{H2}$ and $n_{L2}$;

an average refraction index determined by averaging the refraction index regarding a semiconductor making up a portion of said resonator part made up of the semiconductor, which portion is in contact with the dielectric distributed Bragg reflector, over a range where the optical path length measured from the contact interface is within ¼ of the lasing wavelength $\lambda_0$ by a symbol $n_{S1}$; and refraction indexes of a high refraction-index layer and a low refraction-index layer, which compose said dielectric distributed Bragg reflector, respectively by symbols $n_{H1}$ and $n_{L1}$, semiconductor materials composing the resonator part made up of the semiconductor, semiconductor materials making up the high refraction-index layer and the low refraction-index layer of the semiconductor distributed Bragg reflector, and dielectric materials making up the high refraction-index layer and the low refraction-index layer of the dielectric distributed Bragg reflector are selected such that $n_{S1}$, $n_{H1}$, and $n_{L1}$ satisfy the following condition defined by equation (1), and $n_{S2}$, $n_{H2}$, and $n_{L2}$ satisfy the following condition defined by equation (2):

$$n_{H1} > f(n_{S1})n_{L1}^2 + g(n_{S1})n_{L1} + h(n_{S1}) \quad (1)$$

where $n_{S1} > n_{L1}$ and
$f(n_{S1}) = 0.0266\, n_{S1}^2 - 0.2407\, n_{S1} + 0.6347$
$g(n_{S1}) = -0.0508\, n_{S1}^2 + 0.4335\, n_{S1} - 0.0085$
$h(n_{S1}) = 0.0382\, n_{S1}^2 - 0.3194\, n_{S1} + 0.7398$ $$(n_{H2} - n_{L2}) > 0.4, \text{ where } n_{H2} > n_{L2} \text{ and } n_{S2} > n_{L2}. \quad (2)$$

The emission-type semiconductor laser of the second embodiment of the present invention is:

a surface-emission type semiconductor laser employing a dielectric distributed Bragg reflector and on an opposite side thereof, a semiconductor distributed Bragg reflector, and comprising a resonator part made up of a semiconductor sandwiched by said dielectric distributed Bragg reflector and the semiconductor distributed Bragg reflector, wherein relative to a lasing wavelength $\lambda_0$ of said surface-emission type semiconductor laser, an optical path length L of said resonator part made up of the semiconductor is selected such that $1.4 \times \lambda_0 \leq L \leq 1.6 \times \lambda_0$, and in relation to a light of lasing wavelength $\lambda_0$, when denoting:

a refraction index of a semiconductor making up a portion of said resonator part made up of the semiconductor, which portion is in contact with the semiconductor distributed Bragg reflector by a symbol $n_{S2}$;

refraction indexes of a high refraction-index layer and a low refraction-index layer, which compose said semiconductor distributed Bragg reflector, respectively by symbols $n_{H2}$ and $n_{L2}$;

an average refraction index determined by averaging the refraction index regarding a semiconductor making up a portion of said resonator part made up of the semiconductor, which portion is in contact with the dielectric distributed Bragg reflector, over a range where the optical path length measured from the contact interface is within ¼ of the lasing wavelength $\lambda_0$ by a symbol $n_{S1}$; and refraction indexes of a high refraction-index layer and a low refraction-index layer, which compose said dielectric distributed Bragg reflector, respectively by symbols $n_{H1}$ and $n_{L1}$, semiconductor materials composing the resonator part made up of the semiconductor, semiconductor materials making up the high refraction-index layer and the low refraction-index layer of the semiconductor distributed Bragg reflector, and dielectric materials making up the high refraction-index layer and the low refraction-index layer of the dielectric distributed Bragg reflector are selected such that $n_{S1}$, $n_{H1}$, and $n_{L1}$ satisfy the following condition defined by equation (3), and $n_{S2}$, $n_{H2}$, and $n_{L2}$ satisfy the following condition defined by equation (4):

$$n_{H1} > f(n_{S1})n_{L1}^2 + g(n_{S1})n_{L1} + h(n_{S1}) \quad (3)$$

where $n_{S1} > n_{L1}$ and
$f(n_{S1}) = 0.1553\, n_{S1} - 1.2429\, n_{S1} + 2.7959$
$g(n_{S1}) = -0.2761\, n_{S1}^2 + 2.1387\, n_{S1} - 3.5292$
$h(n_{S1}) = 0.1593\, n_{S1}^2 - 1.2113\, n_{S1} + 2.5512$ $$(n_{H2} - n_{L2}) > 0.4, \text{ where } n_{H2} > n_{L2} \text{ and } n_{S2} > n_{L2}. \quad (4)$$

In the surface-emission type semiconductor laser according to the present invention, in a case when either of the aforementioned first embodiment or second embodiment is selected, it may be constructed in the following structure:

the surface-emission type semiconductor laser characterized in that:

the laser comprises the semiconductor Bragg reflector formed on a semiconductor substrate;

the semiconductor materials, which are used to compose the semiconductor materials making up the high refraction-index layer and the low refraction-index layer of said semiconductor distributed Bragg reflector, are semiconductor materials having n-type conductivity;

the semiconductor used to make up the portion of said resonator part made up of the semiconductor, which portion is in contact with the semiconductor distributed Bragg reflector, is a semiconductor material having n-type conductivity;

an emission region having a structure which is composed of an n-type clad layer, an active layer, and a p-type clad layer that are stacked up in series from the semiconductor substrate side is provided in said resonator part made up of the semiconductor;

a tunnel junction composed of a p$^+$ semiconductor layer/n$^+$ semiconductor layer is formed over said p-type clad layer;

a semiconductor used to make up the portion of said resonator part made up of the semiconductor, which portion is in contact with the dielectric distributed Bragg reflector, is a semiconductor material having n-type conductivity; and said laser further comprises a first n-type electrode provided in the surface of the semiconductor that is used to make up the portion made up of the semiconductor material having n-type conductivity, which portion is in contact with the dielectric distributed Bragg reflector, and a second n-type electrode that is electrically in contact with at least said n-type clad layer, wherein the emission region has such a structure in which injection of holes from said p-type clad layer to said active layer is performed by applying a driving bias between said first n-type electrode and second n-type electrode so as to feed a tunnel current via the tunnel junction made up of said p$^+$ semiconductor layer/n$^+$ semiconductor layer.

Alternatively, in the surface-emission type semiconductor laser according to the present invention, in a case when either of the aforementioned first embodiment or second embodiment is selected, it may be constructed in the following structure:

the surface-emission type semiconductor laser characterized in that:

the laser comprises the semiconductor Bragg reflector formed on a semiconductor substrate;

the semiconductor materials, which are used to compose the semiconductor materials making up the high refraction-index layer and the low refraction-index layer of said semiconductor distributed Bragg reflector, are semiconductor materials having p-type conductivity;

the semiconductor used to make up the portion of said resonator part made up of the semiconductor, which portion is in contact with the semiconductor distributed Bragg reflector, is a semiconductor material having p-type conductivity;

an emission region having a structure which is composed of a p-type clad layer, an active layer, and an n-type clad layer that are stacked up in series from the semiconductor substrate side is provided in said resonator part made up of the semiconductor;

a semiconductor used to make up the portion of said resonator part made up of the semiconductor, which portion is in contact with the dielectric distributed Bragg reflector, is a semiconductor material having n-type conductivity; and said laser further comprises an n-type electrode provided in the surface of the semiconductor that is used to make up the portion made up of the semiconductor material having n-type conductivity, which portion is in contact with the dielectric distributed Bragg reflector, and a p-type electrode that is electrically in contact with at least said p-type clad layer, wherein the emission region has such a structure in which injection of holes from said p-type clad layer to said active layer is performed by applying a driving bias between said n-type electrode and p-type electrode so as to feed a forward direction current therebetween.

On the other hand, in the surface-emission type semiconductor laser according to the second embodiment of the present application, it is preferable to employ the following structure, in which:

in a region included in said resonator part made up of the semiconductor, which region is in contact with the semiconductor distributed Bragg reflector, there is provided an emission region that is composed of an n-type clad layer, an active layer, and a p-type clad layer; and in a region included in said resonator part made up of the semiconductor, which region is placed between said emission region and the dielectric distributed Bragg reflector, there are provided at least two semiconductor layers each having an optical path length of about ¼ of the lasing wavelength $\lambda_0$, which layers are made up of two kinds of semiconductor materials each having a different refraction index.

In the surface-emission type semiconductor laser according to the present invention, in a case if either of the aforementioned structures is selected, it is preferably constructed in the following specific structure:

the surface-emission type semiconductor laser characterized in that:

said light-emitting face is provided on the upper face side of the semiconductor substrate;

the semiconductor distributed Bragg reflector on the opposite face side is formed on said semiconductor substrate;

said semiconductor substrate is a GaAs substrate; and the semiconductor distributed Bragg reflector formed on said semiconductor substrate is made up of at least a layer containing Ga and As, and a layer containing Al, Ga and As.

Effects of the Invention

In the surface-emission type semiconductor laser according to the present invention, such a structure is selected in which the laser comprises a dielectric DBR and on the opposite side thereof, a semiconductor DBR, as an upper DBR and lower DBR to be employed for the construction of a vertical cavity. Further, regarding the resonator part made up of a semiconductor sandwiched by the dielectric DBR and semiconductor DBR, relative to the lasing wavelength $\lambda_0$, in the case when the optical path length L of the resonator part made up of the semiconductor is selected such that $0.9 \times \lambda_0 \leq L \leq 1.1 \times \lambda_0$, the materials, which are respectively used to make up the dielectric DBR, the semiconductor DBR, and the resonator part made up of the semiconductor, are selected according to the condition defined by equations (1) and (2), as described above. Alternatively, in the case when the optical path length L of the resonator part is selected such that $1.4 \times \lambda_0 \leq L \leq 1.6 \times \lambda_0$, the materials, which are respectively used to make up the dielectric DBR, the semiconductor DBR, and the resonator part made up of the semiconductor, are selected according to the condition defined by equations (3) and (4), as described above. As the component ($L_{DBReff2} + L_{DBReff1}$) that are caused by the penetration depth of light into the upper DBR and lower DBR is reduced by such choices, the reduction of the effective optical path length: $L_{eff} = L + (L_{DBReff2} + L_{DBReff1})$ of the resonator is achieved. As a result, in the surface-emission type semiconductor laser according to the present invention, it is possible to realize a further short $L_{eff}$ can be achieved, in comparison with a structure having a shortest effective cavity length: Left among conventional structures which employed a couple of semiconductor DBR for both upper and lower DBRs, that is, a surface-emission type semiconductor laser comprising a half-wavelength micro-cavity in which the optical path length L of the resonator part sandwiched by the DBRs is selected such that $L \approx \lambda_0/2$. Accordingly, in the surface-emission type semiconductor laser according to the present invention, it is possible to achieve further increase in the cut-off frequency for modulation, thereby enabling direct modulation at higher pulse frequencies.

In addition, since the optical path length L of the resonator part made up of the semiconductor is adapted such that $L \approx 2 \times (\lambda_0/2)$, or $L \approx 3 \times (\lambda_0/2)$, it is possible to employ a multiple-quantum-well structure as the active layer of the emission region. In such a case, a problem in performing the injection of current into the quantum well, which is inherent to a surface-emission type semiconductor laser which employs a conventional half-wavelength micro-cavity, can be avoided in the surface-emission type semiconductor laser according to the present invention.

BRIEF DESCRIPTION OF THE DRAWINGS

FIG. 1(a) is a view illustrating the layer structure used to make up a vertical cavity type resonator and a tunnel junction, which are employed in the surface-emission type laser according to the first exemplary embodiment; FIG. 1(b) is a view illustrating a step of processing a tunnel junction part and fabricating an upper dielectric DBR; FIG. 1(c) is a view illustrating a step of mesa etching to form a cylindrical pillar-shaped structure, with which the surface-emission type laser is constructed; and FIG. 1(d) is a view illustrating a step of burying the cylindrical pillar-shaped structure, with which the surface-emission type semiconductor laser is constructed, in polyimide resin to form an electrode thereon;

FIG. 2(a) is a sectional view illustrating the layer structure used to make up a vertical cavity type resonator to be employed in the surface-emission type laser according to the first exemplary embodiment; FIG. 2(b) is a view illustrating a step of fabricating an upper dielectric DBR; FIG. 2(c) is a view illustrating the cylindrical pillar-shaped structure, with which the surface-emission type semiconductor laser is constructed, and the structure of a layer for forming an oxidized current-confining-part; and FIG. 2(d) is a view illustrating a step of burying the cylindrical pillar-shaped structure, with which the surface-emission type semiconductor laser is constructed, in polyimide resin to form an electrode thereon;

FIG. 3(a) is a sectional view illustrating the layer structure used to make up a vertical cavity type resonator and a tunnel junction, which are employed in the surface-emission type laser according to the third exemplary embodiment; FIG. 3(b) is a view illustrating a step of processing a tunnel junction part and fabricating an upper dielectric DBR; FIG. 3(c) is a view illustrating a step of mesa etching to form a cylindrical pillar-shaped structure, with which the surface-emission type laser is constructed; and FIG. 3(d) is a view illustrating a step of burying the cylindrical pillar-shaped structure, with which the surface-emission type semiconductor laser is constructed, in polyimide resin to form an electrode thereon;

DESCRIPTION OF SYMBOLS

Figure 1:
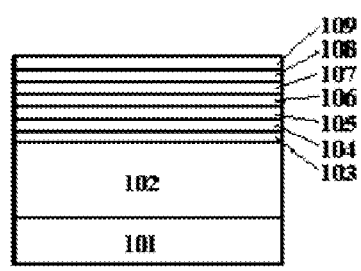
FIGS. 1 (a), (b), (c) and (d) is a drawing schematically showing an outline of a manufacturing process of a surface-emission type semiconductor laser according to a first exemplary embodiment of the present invention.
Figure 1:
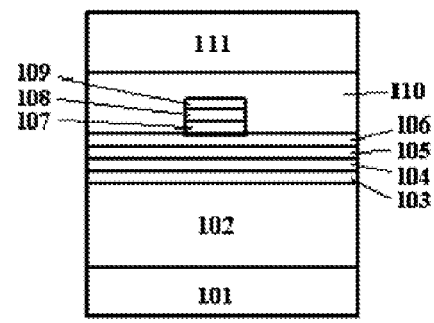
Figure 1:
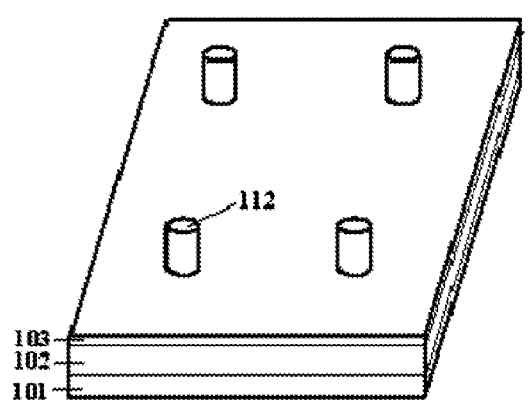
Figure 1:
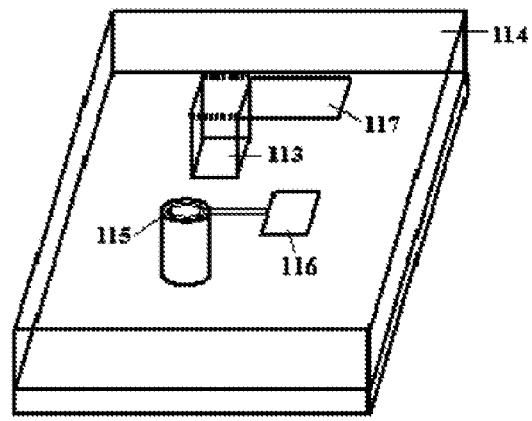

The following symbols shown in the figures have the following meanings respectively.

101 n-GaAs substrate
102 First DBR layer
103 n-GaAs clad layer
104 Multiple-quantum-well type active layer composed of non-doped GaInNAs well layer and GaAs barrier layer
105 p-GaAs clad layer
106 p-GaAs$_{0.25}$P$_{0.75}$ layer
107 p$^+$-In$_{0.1}$Ga$_{0.9}$As layer
108 n$^+$-Ga$_{0.9}$In$_{0.1}$N$_{0.02}$As$_{0.098}$ layer
109 n-GaAs layer
110 n-GaAs buried layer
111 Second DBR structure
112 Cylindrical pillar-shaped structure
113 Electrode
114 Polyimide
115 Ring electrode
116 Pad electrode
117 Pad electrode
201 p-type GaAs substrate
202 First DBR layer
203 Layer made of p-type Al$_{0.98}$Ga$_{0.02}$As for forming an oxidized current-confining-part therefrom
204 p-type Al$_{0.3}$Ga$_{0.7}$As clad layer
205 Multiple-quantum-well type active layer composed of non-doped GaAs well layer and Al$_{0.2}$Ga$_{0.8}$As barrier layer
206 n-type Al$_{0.3}$Ga$_{0.7}$As clad layer
207 n-type Al$_{0.12}$Ga$_{0.85}$As layer
208 n-type GaAs layer
209 Second DBR layer
210 Cylindrical pillar-shaped structure
211 Electrode
212 Polyimide
213 Ring electrode
214 Pad electrode
215 Pad electrode
301 n-GaAs substrate
302 First DBR layer
303 n-GaAs clad layer
304 Multiple-quantum-well type active layer composed of non-doped InGaAs well layer and GaAs barrier layer
305 p-GaAs clad layer
306 p-Al$_{0.3}$Ga$_{0.7}$As layer
307 p$^+$-GaAs$_{0.94}$Sb$_{0.06}$ layer
308 n$^+$-In$_{0.12}$Ga$_{0.88}$As layer 309 n-GaAs layer
310 n-GaAs layer
311 n-Al$_{0.9}$Ga$_{0.1}$As layer
312 n-GaAs layer
313 Second DBR structure
314 Cylindrical pillar-shaped structure
315 Electrode
316 Polyimide
317 Ring electrode
318 Pad electrode
319 Pad electrode

BEST MODE FOR CARRYING OUT THE INVENTION

Hereafter, the present invention will be explained in more detail.

In a surface-emission type semiconductor laser (VCSEL), a vertical cavity is constructed by sandwiching a resonator part formed from semiconductor, which comprises an emission region to provide a gain required for lasing, with an upper DBR and a lower DBR. In this arrangement, for the lasing wavelength $\lambda_0$ of the VCSEL, the thicknesses $d_H$ and $d_L$ of a high refraction-index layer (refraction index: $n_H$) and a low refraction-index layer (refraction index: $n_L$), which compose the DBR, are selected such that $d_H = (\frac{1}{4}) \times (\lambda_0/n_H)$ and $d_L = (\frac{1}{4}) \times (\lambda_0/n_L)$ so that the reflection efficiency for the lasing wavelength $\lambda_0$ is selectively increased. In that case, in the DBR, the optical length $L_H$ of the high refraction-index layer and the optical length $L_L$ of the low refraction-index layer are such that $L_H = L_L = \lambda_0/4$. On the other, regarding the resonator part made of the semiconductor, its optical length L is selected to be an integer multiple of $\frac{1}{2}$ of the lasing wavelength $\lambda e$, that is, $L=m \times (\lambda_0/2)$ so as to satisfy the phase matching condition at both ends.

As so far described, it is an object of the present invention to enable a high-speed operation of a VCSEL by decreasing the effective cavity length thereof. The effective cavity length ($L_{eff}$) is represented, by using the optical length L of the resonator part and the penetration depths ($L_{DBReff1}+L_{DBReff2}$) of light into the DBRs on both sides thereof as:

$$L_{eff}=L+L_{DBReff1}+L_{DBReff2}.$$

Therefore, in order to decrease the effective cavity length ($L_{eff}$), it is necessary to reduce the effective DBR length ($L_{DBReff1}$, $L_{DBReff2}$). The effective DBR length ($L_{DBReff1}$, $L_{DBReff2}$) changes depending on the refraction index of the materials composing the DBR. In a conventional type of VCSEL that has been commonly used, the DBRs are made of semiconductors, and among those, the combination of GaAs and AlAs results in a largest difference in the refraction index, enabling to decrease the effective DBR length ($L_{DBReff1}$, $L_{DBReff2}$). For example, consider a VCSEL formed on a GaAs substrate of a lasing wavelength of $\lambda_0$: 1 µm, in which InGaAs is employed as the active layer. When the DBR is composed of GaAs and AlAs, $L_{DBReff}$ will be about 1.5 µm (3 $\lambda_0/2$). Here, $L_{DBReff}$ is calculated based on Non-Patent Document 1. On the other hand, since L is 0.5 µm when L is arranged to be minimum as $L=\lambda_0/2$ as described in Patent Document 1, $L_{eff}$ will be, on the whole, 3.5 µm (3.5 $\lambda_0$). However, in this case, since the resonator part is a low refraction-index layer as described above, a problem will arise in current injection. On the other hand, even when arrangement is made such that the resonator part has a normal length, that is, $L=\lambda_0$ (i.e. 1 µm in this case), if the effective DBR length ($L_{DBReff1}$, $L_{DBReff2}$) can be sufficiently reduced to be less than 2.5 µm (5 $\lambda_0/2$) on both sides, it is possible to reduce the effective cavity length to less than said 3.5 µm (3.5 $\lambda_0$).

In order to decrease the effective DBR length, it is effective to use a material such as a dielectric which can decrease the refraction index. However, since a dielectric generally has a very low thermal conductivity compared with semiconductors, using dielectrics for the DBRs on both sides will make the heat dissipation difficult and makes it difficult to obtain enough optical output, thus causing a problem in practical use. Therefore, it is necessary to form one of DBRs from a semiconductor, which is suitably used as a heat dissipation path. When a semiconductor DBR is employed on one side in a similar manner to the conventional VCSEL, $L_{DBReff}$ thereof will be 1.5 µm ($3\lambda_0/2$) in the typical example as described above. Therefore, supposing $L_{DBReff}$ of the dielectric DBR side is less than 1 µm ($\lambda_0$), it is possible to reduce the effective cavity length ($L_{eff}$) as a whole to be less than the above described 3.5 µm (3.5 $\lambda_0$) even if the resonator part has a usual length, that is, $L=\lambda_0$ (1 µm in this case).

Figure 4:
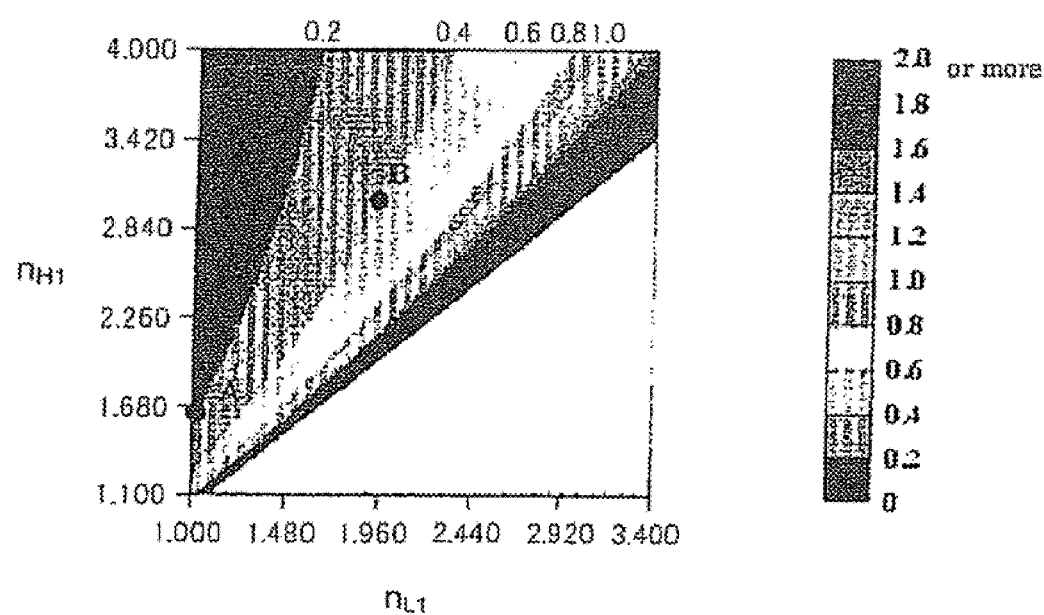
FIG. 4 is a graph to show the penetration depth (optical length: $L_{DBReff1}$) of light into a dielectric DBR for a light of a wavelength in vacuum of 1.0 µm, incoming from a medium of refraction index $n_s=3.5$, which depth is to be observed for each of the combination $(n_{L1}, n_{H1})$ of refraction index: $n_{H1}$ of a high refraction-index layer and refraction index: $n_{L1}$ of a low refraction-index layer, which layers compose the dielectric DBR.

In general, it is known that to decrease the effective length ($L_{DBReff}$) of the DBR, it is effective to increase the difference in the refraction index between the two materials which are used to compose the DBR. However, a detailed investigation made by the inventors has revealed that an increase in refraction index difference does not always result in a decrease in $L_{DBReff}$. FIG. 4 shows a calculation example of $L_{DBReff}$. This is the result of the calculation of $L_{DBReff}$ by varying the refraction indexes of two materials that are used to compose the dielectric DBR with the refraction index ($n_s$) of semiconductor that is in contact with the dielectric DBR being 3.5. With the refraction indexes of said two materials being $n_{H1}$ and $n_{L1}$, it is assumed that $n_s$, $n_{H1} > n_{L1}$. Therefore, of the two layers of said DBR materials, it is the layer of refraction index $n_{L1}$ that is in contact with the above described semiconductor. It is noted that as the calculation method, the method described in Non-Patent Document 1 is used and the film thickness of each layer in the DBR is arranged such that each optical path length of the medium is $\frac{1}{4}$ of the lasing wavelength $\lambda_0$. Further, the number of layers is adjusted such that a reflectance of 99% or higher is obtained at each refraction index. In such a case, it is also assumed that there is no absorption of light in the film. In FIG. 4, for example, a comparison between point A and point B will reveal that although the difference between the two refraction indexes is larger at point B, $L_{DBReff}$ is smaller at point A. Thus, it has been found that a larger difference in the refraction index between the two materials that compose a DBR does not always lead to a decrease of $L_{DBReff}$, and that to decrease $L_{DBReff}$, consideration needs to be given to $n_s$ in addition to the aforementioned refraction indexes ($n_{H1}$, $n_{L1}$) of the two materials. As a result of calculating $L_{DBReff}$ as in the case of FIG. 4 by varying $n_s$ within a possible range of refraction index in a semiconductor, it is confirmed that the relationship among $n_{H1}$, $n_{L1}$, and $n_s$ required to realize said condition: $L_{DBReff2} < 1$ µm ($\lambda_0$) is well approximated by a quadratic equation. This is the equation (1) described in the section of "Means for Solving the Problems". Further, from FIG. 4, it is seen that $L_{DBReff}$ may be less than 0.5 µm ($\lambda_0/2$). In this case, even if the optical length L of the resonator part is 1.5 µm, that is, 3 $\lambda_0/2$, it is possible to make the overall effective cavity length ($L_{eff}$) not more than 3.5 µm (3.5 $\lambda_0$). For this reason, the necessary relationship among $n_{H1}$, $n_{L1}$, and $n_s$ can also be well approximated by a quadratic equation, which results in the equation (3) described above. It is noted that since a dielectric also has a low electric conductivity, it becomes difficult to feed a current through the DBR. Therefore, a current is fed through a layer located closer to the active layer than the dielectric DBR is; however, since increasing the thickness of this layer will result in an increase in the effective cavity length ($L_{eff}$), the thickness of this layer needs to be thin. When feeding a current through such a thin layer in the lateral direction, the resistance will increase, thereby causing problems such as an impedance mismatch and an increase of self-heating. Therefore, it is required that this layer is not of a p-type, which has a high resistivity, but of an n-type.

Figure 5:
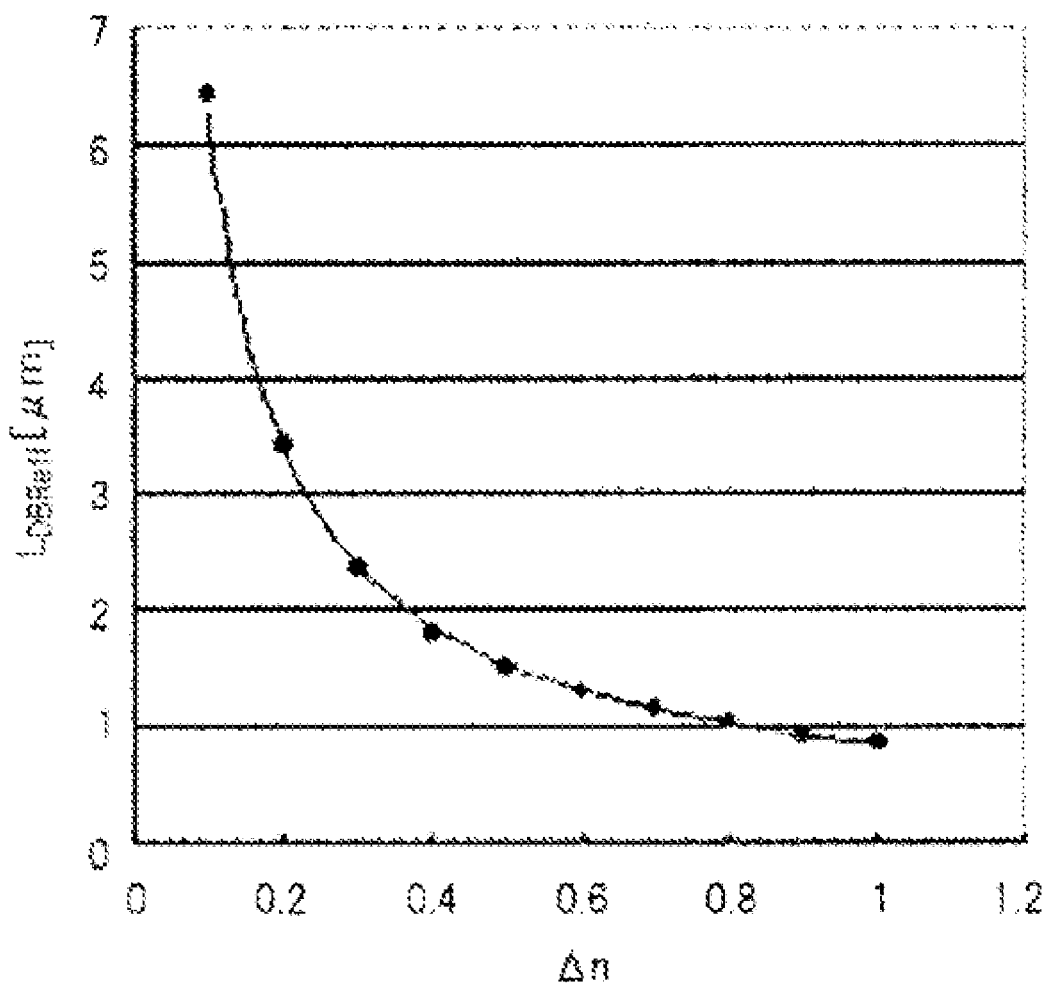
FIG. 5 is a graph to show a plot of the penetration depth (optical length: $L_{DBReff2}$) of light into a semiconductor DBR for a light of a wavelength in vacuum of 1.0 µm, incoming from a medium of refraction index $n_s=3.5$, against $\Delta n = n_{H2} - n_{L2}$, in the case when the refraction index: $n_{H2}$ of a high refraction-index layer and the refraction index: $n_{L2}$ of a low refraction-index layer, which layers compose the semiconductor DBR, are supposed as $n_{L2}=3.0$ and $n_{H2}=3.1 \sim 4.0$.

Further, as pointed out above, although the DBR on one side is needed to be made up of a semiconductor, an increase in the effective length ($L_{DBReff}$) of this DBR will make it difficult to decrease the overall effective cavity length ($L_{eff}$). As shown in FIG. 5, since the effective length of the semiconductor DBR will become very large when the difference in the refraction indexes ($n_{H2}$, $n_{L2}$) of the two materials composing the DBR becomes 0.4 or smaller, it is required that the DBR be composed of materials with a refraction index difference of 0.4 or larger. These conditions are indicated by the above described equations (2) and (4). An example of materials which satisfy this condition includes AlGaAs. It is noted that although, in a strict sense, even in a case of a semiconductor DBR, the refraction index $n_s$ of the semiconductor arranged on the side of the active layer, which is in contact with the DBR, needs to be taken into consideration, the difference among $n_{H2}$, $n_{L2}$, and $n_s$ is small in the semiconductor DBR, and $n_s$ is very often an intermediate value between $n_{H2}$ and $n_{L2}$. In such a case, even when a consideration is given only to the refraction index difference between the two materials composing the DBR as conventionally practiced, the error due to such approximation will be sufficiently small. FIG. 5 shows a calculation example of a case in which the refraction index ($n_{L2}$) of the low refraction-index layer is fixed to be 3, and the refraction index ($n_{H2}$) of the high refraction-index layer is varied from 3.1 to 4.

So far, although explanation has been made on the case in which the lasing wavelength $\lambda_0$ is 1 µm, in the case of a semiconductor device having an other lasing wavelength $\lambda_0$, the values of the optical path length L and $L_{DBReff}$ of the resonator part will change as well as $L_{eff}$ will. However, when the structure according to the present invention is compared with a conventional semiconductor device for each of lasing wavelengths $\lambda_0$, the same relationship holds, and the above described equations (1) and (2) or equations (3) and (4) hold as well. In the above description, although explanation has been made taking typical example of optical path lengths of the resonator part and the effective DBR, with this (optical path length/lasing wavelength) being a parameter, it is seen that, in any lasing wavelength $\lambda_0$, the aforementioned relationships hold in similar, and thus the aforementioned equations (1) and (2), or equations (3) and (4) hold as well.

Based on the explanation given so far, the structural features of the surface-emission laser according to the present invention will be summarized as follows. The surface-emission laser according to the present invention has a structure, in which a resonator part including an active layer is sandwiched by two DBRs, and one of the two DBRs is made up of semiconductors and the other is made up of dielectrics. Said two DBRs are arranged such that respective low refraction-index layers are in contact with the semiconductor of the resonator part. For these dielectric DBR and semiconductor DBR, the dielectric materials and the semiconductor materials, which compose respective DBRs, and the thicknesses of the layers of the resonator part, are selected so as to satisfy the above described equations (1) and (2), and the layer thickness of the resonator part is selected such that the optical path length L of the resonator part made up of the semiconductor is substantially equal to $\lambda_0$, specifically $0.9 \times \lambda_0 \leq L \leq 1.1 \times \lambda_0$. Alternatively, the dielectric material and semiconductor material which compose respective DBRs are selected such that those dielectric DBR and the semiconductor DBR respectively satisfy the above described equations (3) and (4), and the layer thickness of the resonator part is selected such that the optical path length L of the resonator part made up of the semiconductors is around $3 \times (\lambda_0/2)$, specifically $1.4 \times \lambda_0 \leq L \leq 1.6 \times \lambda_0$.

The above described resonator part is made up of a semiconductor, and the semiconductor making up the portion which is in contact with the lower face of the dielectric DBR is also utilized upon providing one of the two electrodes to be used when applying a driving bias of the semiconductor laser. In such an case, the dielectric DBR is processed into a circular shape, and an annular electrode (ring electrode) is formed in such a way to surround the periphery of the circle. The annular electrode (ring electrode) is formed on the semiconductor making up the portion which is in contact with the lower face of the dielectric DBR, and from the viewpoint of electric resistance, it is desirable that the semiconductor of this part is made of a high-concentration doped n-type conductive semiconductor.

In that case, the emission region can be constructed such that the lower-side clad layer which is in contact with the surface of the semiconductor DBR of the lower DBR is a p-type clad layer and the upper clad layer is an n-type clad layer, and that a p-side electrode in electric conduction with the p-type clad layer is provided. In this structure, constitution is such that a driving bias is applied between the n-side electrode and the p-side electrode provided in the upper face to feed a forward direction current so that holes are injected from the p-type clad layer to the active layer. When the lower-side clad layer is set to be a p-type clad layer, the semiconductor DBR is also set to be of p-type.

On the other hand, the emission region may also be constructed such that the lower-side clad layer which is in contact with the surface of the semiconductor DBR of the lower DBR is an n-type clad layer and the upper-side clad layer is a p-type clad layer, and also constructed such that a tunnel junction composed of a $p^+$ semiconductor layer/$n^+$ semiconductor layer is provided between an n-side electrode provided on the upper face and the p-type clad layer. When a tunnel current flows through the tunnel junction composed of the $p^+$ semiconductor layer/$n^+$ semiconductor layer, electrons tunnel through from the valence band of $p^+$ semiconductor layer to the conduction band of the $n^+$ semiconductor layer, resulting in the generation of holes in the valence band of the $p^+$ semiconductor layer. The generated holes are to be injected into the active layer via the p-type clad layer.

A second n-type electrode, which is electrically connected with the n-type clad layer which is in contact with the surface of semiconductor DBR of the lower DBR, is provided and a driving bias is applied between itself and a first n-type electrode, which is formed in the upper face as an annular electrode (ring electrode).

When providing this tunnel junction composed of the $p^+$ semiconductor layer/$n^+$ semiconductor layer, between the p-type clad layer and the n-type semiconductor layer of the outermost surface which makes up the portion that in contact with the lower face of the dielectric DBR of the upper DBR, a $p^+$ semiconductor layer/$n^+$ semiconductor layer made up of semiconductor materials which have a relatively small band-gap energy (Eg) such as, for example, a p-GaAs clad layer, $p$-GaAs$_{0.25}$P$_{0.75}$ layer, $p^+$-In$_{0.1}$Ga$_{0.9}$As layer, $n^+$-Ga$_{0.9}$In$_{0.1}$N$_{0.02}$As$_{0.098}$ layer and n-GaAs layer, are provided to form the tunnel junction. In that case, constitution is preferably selected such that there is a band discontinuity (ΔEv) in the valence band between the p⁺ semiconductor layer and the n⁺ semiconductor layer.

Further, when the optical path length: L of the resonator part itself is arranged as L≈$\lambda_0$, the following arrangement is preferable regarding the emission region that is arranged in the resonator part.

The emission region is constructed such that a clad layer is provided on each side of the active layer, for which a quantum well structure is used. In that case, the optical length: $L_2$ from the center of the active layer, which is formed by using the quantum well structure, to the surface of the semiconductor DBR of the lower DBR is arranged as $L_2$≈$\lambda_0$/2, and therefore the optical length: $L_1$ from the center of the active layer, which is formed by using the quantum well structure, to the lower face of the dielectric DBR of the upper DBR is also arranged as $L_1$≈$\lambda_0$/2.

On the other hand, when the optical path length: L of the resonator part itself is arrange to be L≈3×($\lambda_0$/2), the following arrangement is preferable as for the emission region to be arranged in the resonator part.

The emission region is constructed such that a clad layer is provided on each side of the active layer, for which a quantum well structure is used. In that case, the optical length: $L_2$ from the center of the active layer which utilizes the quantum well structure to the surface of the semiconductor DBR of the lower DBR is arranged as $L_2$≈$\lambda_0$/2, and therefore the optical length: $L_1$ from the center of the active layer, which is formed by using the quantum well structure, to the lower face of the dielectric DBR of the upper DBR is set as $L_1$≈$\lambda_0$.

In this case, compared with the case in which the optical path length: L of the resonator part itself is arranged as L=$\lambda_0$, the distance from the active layer to the dielectric DBR increases by ($\lambda_0$/2) as the optical length. This region may be constructed as shown below.

The region corresponding to ($\lambda_0$/2) as the optical length is divided into two portions corresponding to about ($\lambda_0$/4) as the optical length to form semiconductor layers having respectively different refraction indexes. In such a case, since the semiconductor layer which is in contact with the lower face of the dielectric DBR is also utilized for the formation of an annular electrode (ring electrode), it is preferably made of a n-type conductive semiconductor doped at high concentration. With the refraction index of the low refraction-index layer of the dielectric DBR being represented by $n_L$, the refraction indexes of a region divided into two portions corresponding to the above described ($\lambda_0$/4) by $n_a$ and $n_b$ from the closer side to the dielectric DBR, and an average refraction index of the region further toward the active layer by $n_c$, it becomes possible to make these portions work as a mirror layer by selecting the materials such that $n_a$, $n_c$>$n_b$, and $n_a$>$n_L$.

As for $n_{H1}$, $n_{L1}$, and $n_{S1}$ in the above described equations (1) and (3), it is preferable to select materials which satisfy the condition: $n_{H1}/n_{S1}$<$n_{S1}/n_{L1}$. Further, as for $n_{H2}$, $n_{L2}$ in the above described equations (2) and (4), with $n_{S3}$ being the average refraction index from the interface between the semiconductor DBR and the resonator part, to the center of the active layer, it is preferable to select materials which satisfy the condition: $n_{H2}/n_{S3}$<$n_{S3}/n_{L2}$.

Hereafter, by way of concrete examples, the constitution of the surface-emission type semiconductor laser of the present embodiment will be explained in more detail.

First Exemplary Embodiment

Hereafter, the structure of the surface-emission type semiconductor laser, device according to a first exemplary embodiment of the present invention will be explained with reference to FIG. 1. This first exemplary embodiment is an example of an application of the present invention to a tunnel-junction type surface-emission laser having a lasing wavelength $\lambda_0$=1.3 μm, which is formed on a GaAs substrate.

First, as shown in FIG. 1(a), a first DBR layer 102 which is formed by stacking up plurality of DBRs (n-type semiconductor mirror layer) composed of a pair of an n-type GaAs layer and an n-type AlAs layer as an elementary unit; an n-type GaAs clad layer 103; multiple-quantum-well active layer 104 composed of non-doped GaInNAs well layer and GaAs barrier layer; a p-GaAs clad layer 105; a p-GaAs$_{0.25}$P$_{0.75}$ layer 106; a p⁺-In$_{0.1}$Ga$_{0.9}$As layer 107; an n⁺-Ga$_{0.9}$In$_{0.1}$N$_{0.02}$As$_{0.98}$ layer 108; and an n-GaAs layer 109 are successively stacked up on an n-type GaAs substrate 101 by a metal-organic chemical vapor deposition (MOCVD) method (step 1). The film thickness: $d_{H2}$ of the n-type GaAs layer and the film thickness: $d_{L2}$ of the n-type AlAs layer, which layers compose the first DBR layer 102, are respectively set as $d_{H2}$≈(¼)×($\lambda_0/n_{H2}$) and $d_{L2}$≈(¼)×($\lambda_0/n_{L2}$) in relation to the refraction index: $n_{H2}$ of the n-type GaAs layer and the refraction index: $n_{L2}$ of the n-type AlAs layer at the lasing wavelength $\lambda_0$. Thus, the optical path lengths ($n_{L2}$×$d_{L2}$ and $n_{H2}$×$d_{H2}$) in these media are set to be about ¼ of the lasing wavelength $\lambda_0$.

Carbon is used as a p-type dopant for the p⁺-In$_{0.1}$Ga$_{0.9}$As layer 107 with the p-doping concentration being 8×10¹⁹ cm⁻³, and Selenium is used as an n-type dopant for the n⁺-Ga$_{0.9}$In$_{0.1}$N$_{0.02}$As$_{0.098}$ layer 108, with the n-doping concentration being 5×10¹⁹ cm⁻³. Further, the thickness of the p⁺-In$_{0.1}$Ga$_{0.9}$As layer 107 is set to be 5 nm, and the thickness of the n⁺-Ga$_{0.9}$In$_{0.1}$N$_{0.02}$As$_{0.098}$ layer 108 is set to be 10 nm. On the other hand, the thickness of the p-GaAs$_{0.25}$P$_{0.75}$ layer 106 is set to be 15 nm. In this structure, the p⁺-In$_{0.1}$Ga$_{0.9}$As layer 107 and the n⁺-Ga$_{0.9}$In$_{0.1}$N$_{0.02}$As$_{0.098}$ layer 108, which are doped at high concentration, compose a tunnel junction.

Next, after forming a circular resist mask of a diameter of about 6 μm by the photolithography technology, the p⁺-In$_{0.1}$Ga$_{0.9}$As layer 107, the n⁺-Ga$_{0.9}$In$_{0.1}$N$_{0.2}$As$_{0.098}$ layer 108 and the n-GaAs layer 109 are etched away into a mesa shape by selective etching. Thereafter, the photo-resist is removed (step 2).

Next, a resist mask of a diameter of about 15 μm is formed such that its central axis is aligned with that of the mesa part (tunnel junction) of a diameter of about 6 μm formed in the step 2, and implantation with oxygen ions are carried out. It is noted that the depth of oxygen ion implantation is set to be about 1 μm so as to reach into the first DBR layer 102. Thereafter, the photo-resist is removed (step 3). The area into which oxygen ions are implanted is converted into a high-resistance layer; an electrically effective device size will be a circular shape of a diameter of about 15 μm, enabling to reduce the electric capacity of the device. As a result of this, it becomes possible to relax the restriction on the cut-off frequency due to a so-called CR time constant, and to perform high-speed modulation.

Next, by using an MOCVD method, the n-GaAs layer 110 is grown thereon (step 4). The optical path length from the surface of the first DBR layer 102 to the center of the multiple-quantum-well active layer 104 is set to be ½ of the lasing wavelength $\lambda_0$, and the optical path length from the center of the multiple-quantum-well active layer 104 to the surface of the n-GaAs layer 110 is set so as to approximately correspond to the lasing wavelength $\lambda_0$.

Next, as shown in FIG. 1(b), on this wafer, a second DBR layer 111, in which multiple DBRs (dielectric mirror layers)

composed of a pair of a SiO$_2$ layer and an amorphous silicon (a-Si) layer are stacked up as an elementary unit, is formed by using sputtering (step 5).

The film thickness of the SiO$_2$ layer: d$_{L1}$ and the film thickness of the a-Si layer: d$_{H1}$ are set respectively as d$_{H1}\approx$(¼)×($\lambda_0$/n$_{H1}$) and d$_{L1}\approx$(¼)×($\lambda_0$/n$_{L1}$) relative to the refraction index of the a-Si layer: n$_{H1}$ and the refraction index of the SiO$_2$ layer: n$_{L1}$ at the lasing wavelength $\lambda_0$. Thus, the optical path lengths (n$_{L1}$×d$_{L1}$ and n$_{H1}$×d$_{H1}$) in these media are set to be about ¼ of the lasing wavelength $\lambda_0$.

Next, resist is applied, and a circular mask of a diameter of about 10 μm is formed by the photolithography technology in coaxial with the circular mesa part (tunnel junction part) of the diameter of about 6 μm formed in the step 2. Thereafter, using the circular mask of the diameter of about 10 μm, the second DBR layer 111 is etched into a circular shape of a diameter of about 10 μm. Thereafter, the mask is removed (step 6).

Next, after forming a circular mask of a diameter of about 20 μm in coaxial with the circular pattern formed in the steps 2 and 6, etching is performed up to the inside of the n-type GaAs clad layer 103 to form a cylindrical pillar structure 112 (step 7, see FIG. 1(*c*)). Thereafter, the resist is removed. Next, an electrode is formed on the n-type GaAs clad layer 103 which is exposed by said mesa etching. First, after applying photo-resist on the entire surface, only the portion where an electrode is to be formed is removed by lithography. After vapor-depositing AuGeNi, said photo-resist is removed to lift off the AuGeNi so that an electrode 113 is formed on a part of the n-type GaAs clad layer 103 (step 8).

Next, after burying the mesa with polyimide 114, the polyimide on the electrode 113 formed in the step 7 is removed by lithography (step 9). Then, an electrode is formed. First, a photo-resist is applied, and after patterning it by mask exposure, AuGeNi is vapor-deposited thereon, and then said photo-resist is removed to lift off the AuGeNi so as to form a ring electrode 115 and a pad electrode 116 connected therewith. Further, in this step, a pad electrode 117 is coincidentally formed on the polyimide and is connected to the aforementioned electrode 113 formed on the n-type GaAs clad layer 103 in the step 8 (step 10, see FIG. 1(*d*)). The VCSELs thus fabricated on the GaAs substrate may be used by cutting them into single pieces or desired arrayed forms (for example, 1 by 10 and 100 by 100, etc.).

In this first exemplary embodiment, the optical path length from the surface of the first DBR layer 102 to the surface of the n-GaAs layer 110, which is corresponding to a resonator part sandwiched by the two DBRs, is about 3/2 of the lasing wavelength $\lambda_0$ (L=(3/2)×$\lambda_0$). Moreover, the second DBR layer 111 made up of dielectric is composes of a SiO$_2$ layer of a refraction index: n$_{L1}$ of about 1.45 and an a-Si layer of a refraction index: n$_{H1}$ of about 3.65. The n-GaAs layer 110, which is a semiconductor in contact with said dielectric DBR (second DBR layer) 111, has a refraction index (n$_{GaAs}$) of about 3.41. Further the thickness of the n-GaAs layer 110 which covers the tunnel junction part is 260 nm, which is selected to be (¼)×($\lambda_0$/n$_{GaAs}$)(=96 nm) or thicker in relation to the lasing wavelength $\lambda_0$=1.3 μm. Therefore, the refraction index: n$_{H1}\approx$3.65 of the high refraction-index layer (a-Si layer), the refraction index: n$_{L1}\approx$1.45 of the low refraction-index layer (SiO$_2$ layer), which layers compose the dielectric DBR (second DBR layer) 111, and the average refraction index n$_{S1}\approx$3.41 within ¼ period of light in the semiconductor in contact with the dielectric DBR satisfy the requirements specified in the above described equation (3).

On the other hand, the refraction index difference $\Delta$n=n$_{H2}$−n$_{L2}$ between the n-type GaAs layer (n$_{H2=3.4}$) and n-type AlAs layer (n$_{L2}$=2.9), which layer compose the semiconductor DBR of the first DBR layer 102, is about 0.50 and satisfies the requirement specified in the above described equation (4).

In that case, the thickness: d$_{H2}$ of the n-type GaAs layer (n$_{H2=3.4}$) is set as d$_{H2}\approx$(¼)×($\lambda_0$/n$_{H2}$)=96 nm; and the thickness: du of the n-type AlAs layer (n$_{L2}$=2.9) is set as d$_{L2}$ (¼)×($\lambda_0$/n$_{L2}$)=112 nm, relative to the lasing wavelength $\lambda_0$=1.3 μm.

On the other hand, as for the effective DBR length (optical path length), referring to FIG. 5, when the refraction index difference between the high refraction-index layer and the low refraction-index layer, which layers compose the semiconductor DBR, is given as $\Delta$n≈0.50, the penetration depth of light, that is, effective DBR length L$_{DBReff2}$ is given as L$_{DBReff2}\approx$1.5 μm=3×($\lambda_0$/2) relative to the lasing wavelength $\lambda_0$=1.0 μm. For the lasing wavelength o=1.0 μm, the effective penetration depth L$_{DBReff2}$ is corresponding to three pairs in the unit of the pair of n-type GaAs layer (n$_{H2}$=3.4)/n-type AlAs layer (n$_{L2}$=2.9). From similar calculation, it will be seen that for lasing wavelength $\lambda_0$=1.3 μm as well, the effective DBR length: L$_{DBReff2}$ is given as L$_{DBReff2}\approx$3×($\lambda_0$/2).

On the other hand, for the lasing wavelength $\lambda_0$=1.3 μm, the thickness d$_{H1}$ of the a-Si layer (n$_{H1}$=3.65) and the thickness d$_{L1}$ of the SiO$_2$ layer (n$_{L1}$=1.45), which layers compose the dielectric DBR, are set as d$_{H1}\approx$(¼)×($\lambda_0$/n$_{H1}$)=89 nm and d$_{L1}$ (¼)×($\lambda_0$/n$_{L1}$)=224 nm, respectively.

Referring to FIG. 4, in the case of the lasing wavelength $\lambda_0$=1.0 μm, when the refraction indexes of the high refraction-index layer and the low refraction-index layer, which layers compose the dielectric DBR, are given as n$_{H1}$=3.65 and n$_{L1}$=1.45, the effective DBR length: L$_{DBReff1}$ is given as L$_{DBReff1}\approx$0.17 μm≈($\lambda_0$/6). Through similar calculation, it is seen that for the lasing wavelength $\lambda_0$=1.3 μm as well, the effective DBR length: L$_{DBReff1}$ is given as L$_{DBReff1}\approx$($\lambda_0$/6).

The optical path length from the surface of the first DBR layer 102 to the center of the multiple-quantum-well active layer 104 is set to be ½ of the lasing wavelength $\lambda_0$, and the optical path length from the center of multiple-quantum-well active layer 104 to the surface of the n-GaAs layer 110 is set to be approximately equivalent to the lasing wavelength $\lambda_0$. For the lasing wavelength $\lambda_0$, the effective refraction index of the resonator region sandwiched by the first DBR layer 102 and the second DBR layer 111 can be regarded as n$_s\approx$3.41 as described above. The optical path length L of this resonator region is equivalent to (½+1) of the lasing wavelength $\lambda_0$, that is, L≈(3/2)×$\lambda_0$.

Regarding the VCSEL having the above described structure, the optical path length L$_{eff}$ of the resonator region including the penetration depth of light: L$_{DBReff2}$ and L$_{DBReff1}$ for the first DBR layer 102 and the second DBR layer 111 is given as L$_{eff}$=L+(L$_{DBReff2}$+L$_{DBReff1}$)≈(3/2)×$\lambda_0$+3×($\lambda_0$/2)+($\lambda_0$/6)<(7/2)×$\lambda_0$, indicating that a further smaller effective cavity length has been achieved even in comparison with the VCSEL comprising the half-wavelength micro-cavity disclosed in the Patent Document 1 explained above.

Therefore, when optical pulses are generated by direct modulation, in which driving voltage is modulated in a pulsed form, the transient time required for the rise-up and fall-down of pulse is reduced, thereby enabling a higher-speed modulation.

Second Exemplary Embodiment

Figure 2:
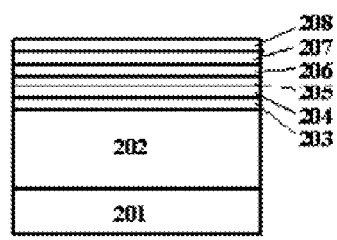
FIGS. 2 (a), (b), (c) and (d) is a drawing schematically showing an outline of a manufacturing process of a surface-emission type semiconductor laser according to a second exemplary embodiment of the present invention.
Figure 2:
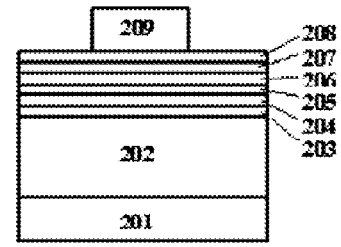
Figure 2:
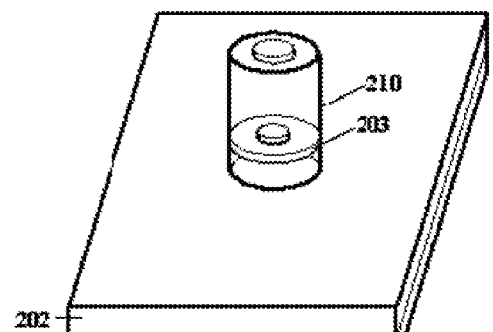
Figure 2:
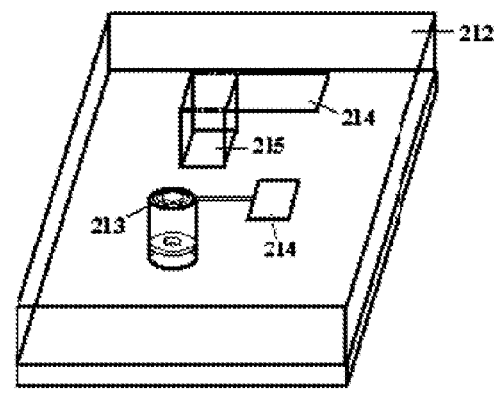

Hereafter, the structure of a surface-emission type semiconductor laser device according to a second exemplary embodiment of the present invention will be explained with reference to FIG. 2. This second exemplary embodiment is an example of an application of the present invention to a surface-emission type laser of a lasing wavelength $\lambda_0$=0.85 µm formed on a GaAs substrate.

First, as shown in FIG. 2(a), a first DBR layer 202 which is formed by stacking up plurality of DBRs (p-type semiconductor mirror layer) composed of a pair of a p-type $Al_{0.12}Ga_{0.85}As$ layer and a p-type $Al_{0.9}Ga_{0.1}As$ as an elementary unit; a layer for forming an oxidized current-confining-part 203 of p-type $Al_{0.98}Ga_{0.02}As$; a p-type $Al_{0.3}Ga_{0.7}As$ clad layer 204; multilayer quantum well active layer 205 composed of a non-doped GaAs well layer and an $Al_{0.12}Ga_{0.8}As$ barrier layer; an n-type $Al_{0.3}Ga_{0.7}As$ clad layer 206; an n-type $Al_{0.12}Ga_{0.85}As$ layer 207; and a thin n-type GaAs layer 208 are successively stacked up on a p-type GaAs substrate 201 by a metal-organic chemical vapor deposition (MOCVD) method (step 1). The film thickness: $d_{H2}$ of the p-type $Al_{0.12}Ga_{0.85}As$ layer and the film thickness $d_{L2}$ of the p-type $Al_{0.9}Ga_{0.1}As$ layer, which layers compose the first DBR layer 202, are respectively set as $d_{H2} \approx (1/4) \times (\lambda_0/n_{H2})$ and $d_{L2} \approx (1/4) \times (\lambda_0/n_{L2})$, relative to the refraction index: $n_{H2}$ of the p-type $Al_{0.12}Ga_{0.85}As$ layer and the refraction index: $n_{L2}$ of the p-type $Al_{0.9}Ga_{0.1}As$ layer at the lasing wavelength $\lambda_0$. Thus, the optical path lengths ($n_{L2} \times d_{L2}$ and $n_{H2} \times d_{H2}$) in these media are set to be about ¼ of the lasing wavelength $\lambda_0$.

The optical path length from the surface of the first DBR layer 202 to the center of the multiple-quantum-well active layer 205 and the optical path length from the center of the multiple-quantum-well active layer 205 to the surface of the n-GaAs layer 208 are both set so as to be approximately equivalent to ½ of the lasing wavelength $\lambda_0$.

Next, on this wafer, a second DBR layer 209, in which plurality of DBRs (dielectric mirror layers) composed of a pair of a $SiO_2$ layer and a $SiN_x$ layer as an elementary unit are stacked up, is formed by using sputtering (step 2).

The film thickness of $SiO_2$ layer: $d_{H1}$ and the film thickness of the $SiN_x$ layer: $d_{L1}$ are set respectively as $d_{H1} \approx (1/4) \times (\lambda_0/n_{H1})$ and $d_{L1} \approx (1/4) \times (\lambda_0/n_{L1})$, relative to the refraction index of the $SiN_x$ layer: $n_{H1}$ and the refraction index of the $SiO_2$ layer: $n_{L1}$ at the lasing wavelength $\lambda_0$. Thus, the optical path lengths ($n_{L1} \times d_{L1}$ and $n_{H1} \times d_{H1}$) in these media are set to be about ¼ of the lasing wavelength $\lambda_0$.

Next, resist is applied, and after a circular mask of a diameter of about 10 µm is fabricated by the photolithography technology, a second DBR layer 209 is etched. Thereafter, the mask is removed (step 3, see FIG. 2 (b)). Next, after a circular etching mask of a diameter of about 25 µm is formed in coaxial with the circular pattern formed in the step 3, etching is performed from the n-type GaAs layer 208 to about 0.5 to 1 µm from the surface of the first DBR layer 202 to form a cylindrical pillar structure 210 (step 4). As a result of this mesa forming step, the side face of the layer for forming the current-confining-part 203 is exposed. Thereafter, the etching mask is removed. Next, heating is performed at a temperature of about 450° C. for about 10 minutes in a furnace underwater vapor atmosphere (step 5). As a result of this oxidation processing, only the layer for forming the current-confining-part 203 is selectively oxidized in an annular shape from its outer periphery (see FIG. 2(c)). By adjusting the oxidation time, a non-oxidized region of a diameter of about 6 µm is formed in the central part of the layer for forming the current-confining-part 203 made of p-type $Al_{0.98}Ga_{0.02}As$. The structure composed of the annular oxidized region and the non-oxidized region in the central part, which are formed in the layer for forming the current-confining-part 203, is referred to as "a current-confining-part". In the current-confining-part, current passing through the non-oxidized region of a diameter of about 6 µm in the central part exhibits substantially no diffusion in the lateral direction in the p-type $Al_{0.03}Ga_{0.7}As$ clad layer 204, and is injected into the multilayer-quantum-well active layer 205. Thus, the density distribution of the current to be injected into the multilayer-quantum-well active layer 205 becomes a shape centered within the portion of a diameter of about 6 µm in the central part.

Next, an electrode is formed on the first DBR layer 202 which is exposed by said mesa etching. First, after photo-resist is applied on the entire surface, only a portion where a p-type electrode is to be formed is removed by lithography. After Ti/Pt/Au is vapor deposited, said photo-resist is removed to lift off the Ti/Pt/Au so that an electrode 211 is formed on the surface of the first DBR layer 202 (step 6). Next, after the mesa is buried with polyimide 212, the polyimide on the electrode 211 formed in the step 6 is removed by lithography (step 7).

Next, an n-side electrode is formed. First, photo-resist is applied, and after patterning is performed by mask exposure, AuGeNi is deposited, and then said photo-resist is removed to lift off the AuGeNi so as to form a ring electrode 213 and a pad electrode 214 connected thereto. Moreover, in this step, a pad electrode 215 is coincidentally formed on polyimide and is connected with the electrode 211 on the first DBR, which is formed in the step 6 as mentioned above (step 8, see FIG. 2(d)). Here, the inner diameter and outer diameter of the ring electrode 213 are set respectively to be 10 µm and 15 µm.

Next, after photo-resist is applied onto the wafer, a circular mask of a diameter of 16 µm is fabricated in coaxial with the ring electrode by lithography. Next, protons are implanted. The depth of proton implantation, which is 1 µm, is set to reach into the first DBR layer 202. That is, excepting the central region of a diameter of 16 µm covered with mask, protons are implanted into the peripheral portion of the mesa of a diameter of about 25 µm to increase resistance (step 9). Thus, by limiting pn junction only in the circular region of a diameter of 16 µm, the capacity of the mesa periphery is decreased. Thus, the VCSEL thus fabricated on the GaAs substrate may be cut into single pieces or into desired arrayed forms (for example, 1 by 10 and 100 by 100, etc.) for use.

In this second exemplary embodiment, the optical path length from the surface of the first DBR layer 202 to the surface of the n-GaAs layer 208, which is a resonator part sandwiched by the two DBRs, is approximately equal to the lasing wavelength $\lambda_0$ (L≈(2/2)×$\lambda_0$). Moreover, the second DBR layer 209 made up of a dielectric is composed of a $SiO_2$ layer of a refraction index: $n_{L1}$ of about 1.45, and a $SiN_x$ layer of a refraction index: $n_{H1}$ of about 1.9. At the lasing wavelength $\lambda_0$=0.85 µm, the n-GaAs layer 208, which is a semiconductor in contact with said dielectric DBR (second DBR layer) 209, has a refraction index ($n_{GaAs}$) of about 3.64.

It is noted that the thickness of the n-GaAs layer 208 is 58 nm and approximately equals to $(1/4) \times (\lambda_0/n_s)(\approx 58$ nm$)$ in relation to the lasing wavelength $\lambda_0$=0.85 µm. Thus, the refraction index: $n_{H1} \approx 1.93$ of the high refraction-index layer ($SiN_x$ layer), the refraction index: $n_{L1} \approx 1.45$ of the low refraction-index layer ($SiO_2$ layer), which layers compose the dielectric DBR (second DBR layer) 209, and the average refraction index $n_{S1} \approx 3.64$ within ¼ period of light in the semiconductor, which is in contact with the dielectric DBR, satisfy the requirements specified in the above described equation (1).

On the other hand, the refraction index difference: $\Delta n = n_{H2} - n_{L2}$ between the p-type $Al_{0.12}Ga_{0.88}As$ layer ($n_{H2}$=3.49) and the p-type $Al_{0.9}Ga_{0.1}As$ layer ($n_{L2=3.0}$), which layers compose the semiconductor DBR of the first DBR layer 202, is about 0.49 and satisfies the requirement specified in the above described equation (2).

In the case, the thickness: $d_{H2}$ of the p-type $Al_{0.12}Ga_{0.85}As$ layer ($n_{H2=3.49}$) is set as $d_{H2} \approx (1/4) \times (\lambda_0/n_{H2}) = 61$ nm; and the thickness: $d_{L2}$ of the p-type $Al_{0.9}Ga_{0.1}As$ layer ($n_{L2}$=3.0) is set as $d_{L2} \approx (1/4) \times (\lambda_0/n_{L2}) = 71$ nm, relative to the lasing wavelength $\lambda_0$=0.85 μm. Therefore, the thickness: $d_{DBR2}$ of the entire semiconductor DBR of the first DBR layer 202 is given as $d_{DBR2} = N \times (d_{H2} + d_{L2})$ when it is composed of N pairs of p-type $Al_{0.12}Ga_0.88As$ layer/p-type $Al_{0.9}Ga_{0.1}As$ layers.

Referring to FIG. 5, when the refraction index difference: Δn between the high refraction-index layer and the low refraction-index layer composing the semiconductor DBR is given as Δn≈0.49 in the case of the lasing wavelength o=1.0 μm, the effective DBR length $L_{DBReff2}$ will be given as $L_{DBReff2} \approx 1.53$ μm $\approx 3 \times (\lambda_0/2)$.

From similar calculation, it is seen that $L_{DBReff2} \approx 3 \times (\lambda_0/2)$ even for the lasing wavelength $\lambda_0$=0.85 μm.

On the other hand, relative to the lasing wavelength $\lambda_0$=0.85 μm, the thickness: $d_{H1}$ of the $SiN_x$ layer ($n_{H1} \approx 1.9$) and the thickness: $d_{L1}$ of $SiO_2$ layer ($n_{L1}$=1.45), which layers compose the dielectric DBR, are respectively set as $d_{H1} \approx (1/4) \times (\lambda_0/n_{H1}) = 112$ nm and as $d_{L1} > (1/4) \times (\% O/n_{L1}) = 146$ nm.

Referring to FIG. 4, relative to the lasing wavelength $\lambda_0$=1.0 μm, when the refraction indexes of the high refraction-index layer and the low refraction-index layer, which layers compose the dielectric DBR, are given as $n_{H1} \approx 1.9$ and $n_{L1}$=1.45, effective DBR length $L_{DBReff1}$ will be given as $L_{DBReff1}$=0.35 μm $\approx 3/4 \times (\lambda_0/2)$. For the lasing wavelength $\lambda_0$=0.85 μm as well, it is seen from similar calculation that $L_{DBReff1} \approx 3/4 \times (\lambda_0/2) < (\lambda_0/2)$.

It is noted that the optical path length from the surface of the first DBR layer 202 to the center of the multiple-quantum-well active layer 205, and the optical path length from the center of the multiple-quantum-well active layer 205 to the surface of the n-GaAs layer 208 are set so as to be approximately equivalent to ½ of the lasing wavelength $\lambda_0$. For the lasing wavelength $\lambda_0$, the refraction index of the resonator region, which is sandwiched by the first DBR layer 202 and the second DBR layer 209, may be regarded as $n_s$=3.64, as explained above. The optical path length L of this resonator region is equivalent to (2/2) of lasing wavelength $\lambda_0$, that is, $L \approx (2/2) \times \lambda_0$ and the overall thickness: d of the actual resonator region is given as $d = L/n_s \approx (2/2) \times (\lambda_0/n_s)$.

As for VCSEL having the above described structure, the optical path length $L_{eff}$ of the resonator region, including the penetration depths of light: $L_{DBReff2}$ and $L_{DBReff1}$ for the first DBR layer 202 and the second DBR layer 209, will be given as $L_{eff} = L + (L_{DBReff2} + L_{DBReff1}) \approx (2/2) \times \lambda_0 + 3 \times (\lambda_0/2) + 3/4 \times (\lambda_0/2) < (7/2) \times \lambda_0$.

Therefore, when optical pulses are generated by direct modulation, in which driving voltage is modulated in a pulsed form, a transient time required for the rising-up and falling-down of the pulse is reduced, thereby enabling a higher-speed modulation and to realize a further shorter effective cavity length, even when compared with the VCSEL comprising the half-wavelength micro-cavity disclosed in the Patent Document 1, as explained above.

Third Exemplary Embodiment

Hereafter, the structure of a surface-emission type semiconductor laser device according to a third exemplary embodiment of the present invention will be explained with reference to FIG. 3. This third exemplary embodiment is an example of an application of the present invention to a tunnel-junction-type surface-emission laser of a lasing wavelength $\lambda_0$=1.0 μm formed on a GaAs substrate.

First, as shown in FIG. 3(a), a first DBR layer 302 which is formed by stacking up plurality of DBRs (n-type semiconductor mirror layer) composed of a pair of an n-type GaAs layer and an n-type $Al_{0.9}Ga_{0.1}As$ layer as an elementary unit; an n-type GaAs clad layer 303; a multiple-quantum-well active layers 304 composed of a non-doped InGaAs well layer and a GaAs barrier layer; a p-GaAs clad layer 305; a p-$Al_{0.3}Ga_{0.7}As$ layer 306; a p$^+$-$GaAs_{0.94}Sb_{0.06}$ layer 307; an n$^+$-$In_{0.12}Ga_{0.88}As$ layer 308; and an n-GaAs layer 309 are successively stacked up on a n-type GaAs substrate 301 by a metal-organic chemical vapor deposition (MOCVD) method (step 1). The film thickness: $d_{H2}$ of the n-type GaAs layer and the film thickness: $d_{L2}$ of the n-type $Al_{0.9}Ga_{0.1}As$ layer, which layers compose the first DBR layer 302, are respectively set as $d_{H2} \approx (1/4) \times (\lambda_0/n_{H2})$ and $d_{L2}$ t $(1/4) \times (o/n_{L2})$, relative to the refraction index: $n_{H2}$ of the n-type GaAs layer and the refraction index: $n_{L2}$ of the n-type $Al_{0.9}Ga_{0.1}As$ layer at the lasing wavelength $\lambda_0$. Thus, the optical path lengths ($n_{L2} \times d_{L2}$ and $n_{H2} \times d_{H2}$) in these media are set to be about ¼ of the lasing wavelength $\lambda_0$.

Carbon is used as a p-type dopant for the p$^+$-$GaAs_{0.94}Sb_{0.06}$ layer 307 with a p-doping concentration being $1.5 \times 10^{19}$ cm$^{-3}$, and Si is used as an n-type dopant for the n$^+$-$In_{0.12}Ga_{0.88}As$ layer 308 with an n-doping concentration being $2 \times 10^{19}$ cm$^{-3}$. Moreover, the thickness of the p$^+$-$GaAs_{0.94}Sb_{0.06}$ layer 307 is set to be 5 nm and the thickness of the n$^+$-$In_{0.12}Ga_{0.88}As$ layer 308 is set to be 10 nm. On the other hand, the thickness of the p-$Al_{0.3}Ga_{0.7}As$ layer 306 is set to be 10 nm. In this structure, the p$^+$-$GaAs_{0.94}Sb_{0.06}$ layer 307 and the n$^+$-$In_{0.12}Ga_{0.88}As$ layer 308, which are high-concentration doped, compose a tunnel junction (TJ).

Further, the optical path length from the surface of the first DBR layer 302 to the center of the multiple-quantum-well active layer 304 is set to be about ½ of the lasing wavelength $\lambda_0$. On the other hand, the optical path length from the center of the multiple-quantum-well active layer 304 to the interface between the p$^+$-$GaAs_{094}Sb_{0.06}$ layer 307 and the n$^+$-$In_{0.12}Ga_{0.88}As$ layer 308 is set to be about ¼ of the lasing wavelength $\lambda_0$.

Next, after forming a circular resist mask of a diameter of about 6 μm by the photolithography technology, the p$^+$-$GaAs_{0.94}Sb_{006}$ layer 307, the n$^+$-$In_{0.12}Ga_{0.88}As$ layer 308 and the n-GaAs layer 309 are etched away into a mesa shape by selective etching. Thereafter, the photo-resist is removed (step 2).

Next, a resist mask of a diameter of about 15 μm is formed such that its central axis is aligned with that of the mesa part (tunnel junction) of a diameter of about 6 μm formed in the step 2, and oxygen ions are implanted. It is noted that the depth of oxygen ion implantation is about 1 μm and is set to reach into the first DBR layer 302. Thereafter, the photo-resist is removed (step 3). Since the area into which oxygen ions are implanted becomes a high-resistance layer, an electrically effective device size will be a circular shape of a diameter of about 15 μm, enabling to reduce the electric capacity of the device. As a result of this, it becomes possible to relax the restriction on the cut-off frequency due to a so-called CR time constant, and to perform high-speed modulation.

Next, by using a MOCVD method, an n-GaAs layer 310, an n-$Al_{0.9}Ga_{0.1}As$ layer 311, and an n-GaAs layer 312 are successively grown thereon (step 4). In that case, the optical length from the interface (TJ interface) between the p$^+$-$GaAs_{0.94}Sb_{0.06}$ layer 307 and the n$^+$-$In_{0.12}Ga_{0.88}As$ layer 308 to the surface of the n-GaAs layer 310 is set to be about ¼ of the lasing wavelength $\lambda_0$. Further, the thicknesses of the n-Al$_{0.9}$Ga$_{0.1}$As layer 311 and the n-GaAs layer 312 which cover over the circular TJ part are set such that the optical path lengths in relation to the lasing wavelength $\lambda_0$ both become about ¼ of the lasing wavelength $\lambda_0$. Therefore, the sum of the optical path lengths from the center of the multiple-quantum-well active layer 304 to the n-GaAs layer 312 will approximately equal to the lasing wavelength $\lambda_0$.

Figure 3:
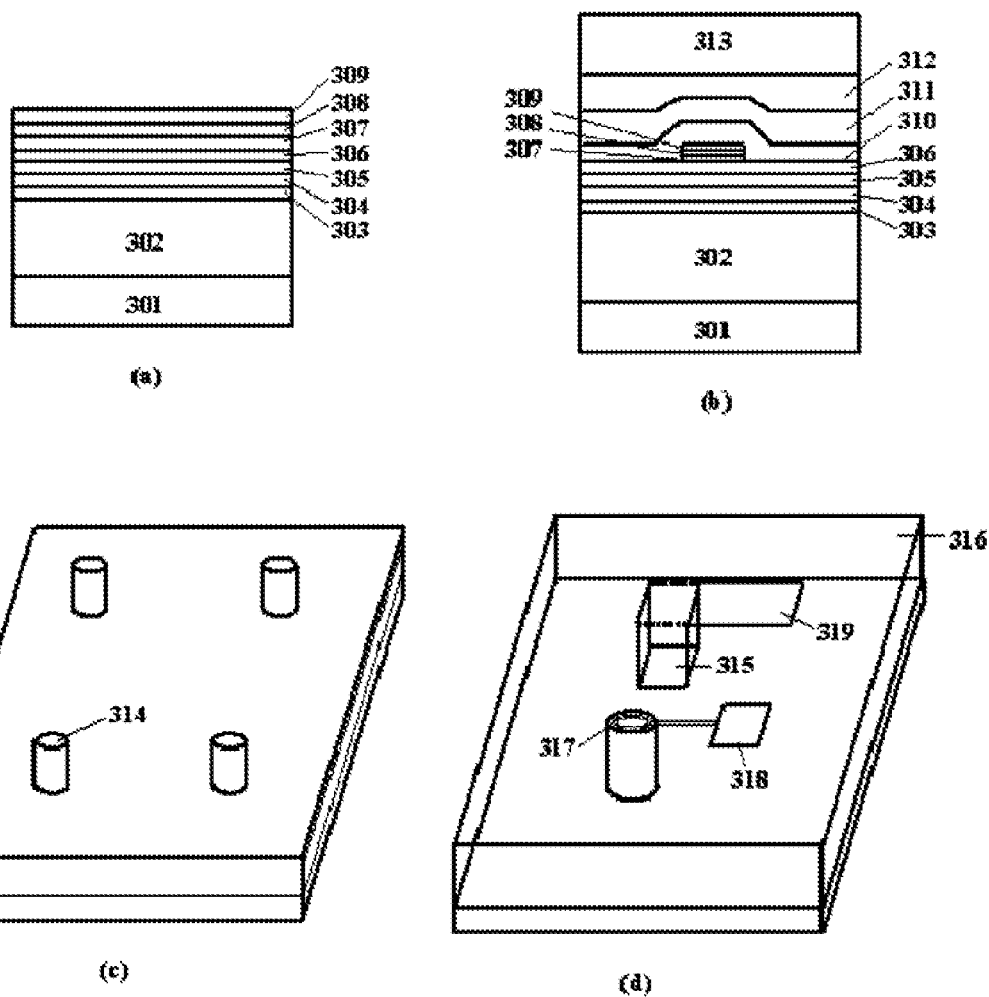
FIGS. 3 (a), (b), (c) and (d) is a drawing schematically showing an outline of a process of manufacturing a surface-emission type semiconductor laser according to a third exemplary embodiment of the present invention.

Next, as shown in FIG. 3 (b), on this wafer, a second DBR layer 313, in which multiple DBRs (dielectric mirror layers) composed a pair of a SiO$_2$ layer and a ZrO$_2$ layer are stacked up as an elementary unit, is formed by using sputtering (step 5).

The film thickness: $d_{L1}$ of the SiO$_2$ layer and the film thickness: $d_{H1}$ of ZrO$_2$ are set respectively as $d_{H1} \approx (¼) \times (\lambda_0/n_{H1})$ and $d_{L1} \approx (¼) \times (\lambda_0/n_{L1})$, relative to the refraction index: $n_{H1}$ of the ZrO$_2$ layer and the refraction index: $n_{L1}$ of the SiO$_2$ layer at the lasing wavelength $\lambda_0$. Thus, the optical path lengths ($n_{L1} \times d_{L1}$ and $n_{H1} \times d_{H1}$) in these media are set to be about ¼ of the lasing wavelength $\lambda_0$.

Next, resist is applied, and a circular mask of a diameter of about 10 μm is fabricated by the photolithography technology in coaxial with the circular mesa part (tunnel junction) of a diameter of about 6 μm formed in the step 2. Thereafter, using the circular mask of the diameter of about 10 μm, the second DBR layer 313 is etched into a circular shape of a diameter of about 10 μm. Thereafter, the mask is removed (step 6).

Next, after forming a circular mask of a diameter of about 20 μm in coaxial with the circular pattern formed in the steps 2 and 6, etching is performed up to the inside of the n-type GaAs clad layer 303 to form a cylindrical pillar structure 314 (step 7, see FIG. 3 (c)). Thereafter, the resist is removed. Next, an electrode is formed on the n-type GaAs clad layer 303 which is exposed by the above described mesa etching and remains in a very thin thickness. First, after applying photo-resist on the entire surface, only the portion where an electrode is to be formed is removed by lithography. After vapor-depositing AuGeNi, said photo-resist is removed to lift off the AuGeNi so that an electrode 315 is formed on a part of the n-type GaAs clad layer 303 which covers the first DBR layer 302 (step 8).

Next, after burying the mesa with polyimide 316, the polyimide on the electrode 315 formed in the step 7 is removed by lithography (step 9). Then, an electrode is formed. First, photo-resist is applied, and after patterning by mask exposure is conducted, AuGeNi is vapor-deposited, and then said photo-resist is removed to lift off the AuGeNi so as to form a ring electrode 317 and a pad electrode 318 connected therewith. Further, in this step, a pad electrode 319 is coincidentally formed on the polyimide and is connected to the electrode 315 formed on the n-type GaAs clad layer 303 in the step 8 as described above (step 10, see FIG. 3 (d)). The VCSELs thus fabricated on the GaAs substrate may be used by cutting them into single pieces or desired arrayed forms (for example, 1 by 10 and 100 by 100 etc.).

In this third exemplary embodiment, the optical path length from the surface of the first DBR layer 302 to the surface of the n-GaAs layer 312, which is corresponding to the resonator part sandwiched by the two DBRs, is about 3/2 of the lasing wavelength $\lambda_0$ (L=(3/2)×$\lambda_0$). Moreover, the second DBR layer 313 made up of a dielectric is composed of a SiO$_2$ layer of a refraction index: $n_{L1}$ of about 1.45 and a ZrO$_2$ layer of a refraction index: $n_{H1}$ of about 2.2. The n-GaAs layer 312, which is a semiconductor in contact with said dielectric DBR (second DBR layer) 313, has a refraction index ($n_{GaAs}$) of about 3.51. Further, the optical path length of the n-GaAs layer 312 is about ¼, relative to the lasing wavelength $\lambda_0$=1.0 μm, and its thickness is (¼)×($\lambda_0/n_{GaAs}$)(≈71 nm). Therefore, the refraction index: $n_{H1} \approx 2.2$ of the high refraction-index layer (ZrO$_2$ layer), the refraction index: $n_{L1} \approx 1.45$ of the low refraction-index layer (SiO$_2$ layer), which layers compose the dielectric DBR (second DBR layer) 313, and the average refraction index $n_{S1} \approx 3.51$ within ¼ period of light in the semiconductor, which is in contact with the dielectric DBR, satisfy the requirements specified in the above described equation (3).

On the other hand, the refraction index difference: $\Delta n = n_{H2} - n_{L2}$ between the n-type GaAs layer ($n_{H2} \approx 3.51$) and n-type Al$_{0.9}$Ga$_{0.1}$As layer ($n_{L2} \approx 3.0$), which layers compose the semiconductor DBR of the first DBR layer 302, is about 0.51 and satisfies the requirement specified in the above described equation (4).

In that case, the thickness: $d_{H2}$ of the n-type GaAs layer ($n_{H2} \approx 3.51$) is set as $d_{H2} \approx (¼) \times (\lambda_0/n_{H2})$=71 nm; and the thickness: $d_{L2}$ of the n-type Al$_{0.9}$Ga$_{0.1}$As layer ($n_{L2} \approx 3.0$) is set as $d_{L2} \approx (¼) \times (\lambda_0/n_{L2})$=83 nm, in the relation to the lasing wavelength $\lambda_0$=1.0 μm.

Referring to FIG. 5, when the refraction index difference between the high refraction-index layer and the low refraction-index layer, which layers compose the semiconductor DBR, is given as $\Delta n \approx 0.51$, an effective DBR length $L_{DBReff2}$ is given as $L_{DBReff2}$=1.48 μm≈3×($\lambda_0/2$), relative to the lasing wavelength $\lambda_0$=1.0 μm.

On the other hand, for the lasing wavelength $\lambda_0$=1.0 μm, the thickness $d_{H1}$ of the ZrO$_2$ layer ($n_{H1} \approx 2.2$) and the thickness $d_{L1}$ of the SiO$_2$ layer ($n_{L1}$=1.45), which layers compose the dielectric DBR, are set as $d_{H1} \approx (¼) \times (\lambda_0/n_{H1})$=114 nm and $d_{L1} \approx (¼) \times (\lambda_0/n_{L1})$=172 nm.

Referring to FIG. 4, relative to the lasing wavelength $\lambda_0$=1.0 μm, when the refraction indexes of the high refraction-index layer and the low refraction-index layer, which layers compose the dielectric DBR, are given as $n_{H1}$=2.2 and $n_{L1}$=1.45, the effective DBR length: $L_{DBReff1}$ is given as $L_{DBReff1} \approx 0.29$ μm≈½×($\lambda_0/2$)<($\lambda_0/2$).

It is noted that the optical path length from the surface of the first DBR layer 302 to the center of the multiple-quantum-well active layer 304 is set to be ½ of the lasing wavelength $\lambda_0$ and the optical path length from the center of the multiple-quantum-well active layer 304 to the surface of the n-GaAs layer 312 is set to approximately correspond to the lasing wavelength $\lambda_0$. Relative to the lasing wavelength $\lambda_0$, the optical path length L of the resonator region, which is sandwiched by the first DBR layer 302 and the second DBR layer 313, is L=(3/2)×$\lambda_0$.

Regarding the VCSEL having the above described structure, the effective optical path length $L_{eff}$ of the resonator region, including light penetration depths; $L_{DBReff2}$ and $L_{DBReff1}$ to the first DBR layer 302 and the second DBR layer 313, is given as $L_{eff} = L + (L_{DBReff2} + L_{DBReff1}) \approx (3/2) \times \lambda_0 + 3 \times (\lambda_0/2) + ½ \times (\lambda_0/2) < (7/2) \times \lambda_0$ indicating that a further shorter effective cavity length has been achieved even when compared with the VCSEL comprising the half-wavelength micro-cavity disclosed in the Patent Document 1, as described above.

Therefore, when optical pulses are generated by direct modulation, in which driving voltage is changed in a pulsed form, the transient time necessary for the rise-up and fall-down of pulse is reduced, thereby enabling a higher-speed modulation.

Further, in this third exemplary embodiment, for the lasing wavelength $\lambda_0$, any of the optical length from the TJ interface to the layer surface of the n-GaAs layer 310, the optical length of the n-Al$_{0.9}$Ga$_{0.1}$As layer 311, and the optical length of the n-GaAs layer 312 is set to be about ¼ of the lasing wavelength $\lambda_0$. Moreover, the optical length from the surface of the first DBR layer 302 to the layer surface of the n-GaAs layer 310 is about (2/2) of the lasing wavelength $\lambda_0$. Therefore, at the interface between the n-GaAs layer 310 and the n-Al$_{0.9}$Ga$_{0.1}$As layer 311 and the interface between the n-Al$_{0.9}$Ga$_{0.1}$As layer 311 and the n-GaAs layer 312, there is a step-like change in the refraction index and the pair of the n-Al$_{0.9}$Ga$_{0.1}$As layer 311 and the n-GaAs layer 312 works as a mirror layer as well.

Since the optical length from the surface of the first DBR layer 302 to the surface of the n-GaAs layer 310 is about (2/2) of the lasing wavelength $\lambda_0$, the boundary condition is satisfied even if the n-Al$_{0.9}$Ga$_{0.1}$As layer 311 and the n-GaAs layer 312 are excluded. In order to decrease the effective cavity length $L_{eff}$, it is preferable to exclude the n-Al$_{0.9}$Ga$_{0.1}$As layer 311 and the n-GaAs layer 312. On the other hand, in the process to feed current to the TJ interface of the central part of the mesa structure via the ring electrode 317, the diffusion of current in the lateral direction takes place. When the n-Al$_{0.9}$Ga$_{0.1}$As layer 311 and the n-GaAs layer 312 are not provided, this current diffusion in the lateral direction will take place within the layer of the n-GaAs layer 310. In that case, although this is an n-type semiconductor layer having a small resistivity, as the layer thickness of the n-GaAs layer 310 is only ($\frac{1}{4}$)×($\lambda_0/n_s$)≈71 nm, this spreading resistance will become an unneglectable amount. On the other hand, when the n-Al$_{0.9}$Ga$_{0.1}$As layer 311 and the n-GaAs layer 312 are provided, said current diffusion process in the lateral direction can relate to the overall layer thickness of the n-GaAs layer 310, the n-Al$_{0.9}$Ga$_{0.1}$As layer 311 and the n-GaAs layer 312, of about 220 nm. For that reason, since the spreading resistance is significantly reduced, the overall electric resistance R of the device can be remarkably reduced.

On the other hand, even when selecting such a structure in which the layer thickness of the n-GaAs layer 310 is given as ($\frac{3}{4}$)×($\lambda_0/n_s$)≈210 nm, but the n-Al$_{0.9}$Ga$_{0.1}$As layer 311 and the n-GaAs layer 312 are not provided, the optical path length of this entire resonator region, which is sandwiched by the first DBR layer 302 and the second DBR layer 313, will be about 3/2 of the lasing wavelength $\lambda_0$ (L (3/2)×$\lambda_0$). Of course, the equations (3) and (4) are satisfied in the case of this structure as well, and when compared with a conventional semiconductor device structure, the effective cavity length $L_{eff}$ becomes shorter.

When comparing this structure with that of the third exemplary embodiment, the structure comprising the n-GaAs layer 310, the n-Al$_{0.9}$Ga$_{0.1}$As layer 311 and the n-GaAs layer 312, which are utilized by the third exemplary embodiment, is equivalent in the effect of reducing the overall electric resistance R of the device, with the structure in which the layer thickness of the n-GaAs layer 310 is ($\frac{3}{4}$)×($\lambda_0/n_s$)≈210 nm. On the other hand, since the partial structure of the n-GaAs layer 310, the n-Al$_{0.9}$Ga$_{0.1}$As layer 311, and the n-GaAs layer 312 works as a mirror layer, it exhibits an effect of reducing the penetration depth of light: $L_{DBReff1}$ to the second DBR layer 313. That is, the effect of reducing the effective cavity length $L_{eff}$ is more superior.

The features of the structure of the surface-emission type semiconductor laser according to the present invention have been illustrated by referring to the three typical exemplary embodiments. It is noted that although the aforementioned exemplary embodiments are examples of the best mode of the present invention, the present invention will not be limited to the exemplary embodiments explained above. Within a range not departing from the scope thereof, various modifications can be made, and for instance, as for the lasing wavelength and the materials used to construct the distribution Bragg reflector of the surface-emission type semiconductor laser according to the present invention, it is possible to select any modes other than those modes illustrated in the aforementioned exemplary embodiments.

Although, so far the present invention has been described with reference to exemplary embodiments (and examples thereof), the present invention will not be limited to the above described exemplary embodiments (and examples thereof). The constitutions and details of the present invention are subject to various modifications which can be understood by those skilled in the art, within the scope of the present invention.

INDUSTRIAL APPLICABILITY

The surface-emission type semiconductor laser comprising a vertical cavity type resonator according to the present invention includes a structure suitable for high-speed modulation applications and is usable as the light source, for example, in the field of short-distance optical communications and optical interconnections in which a data transmission rate of 20 Gbs or higher is required.

The invention claimed is:

1. A surface-emission type semiconductor laser employing a dielectric distributed Bragg reflector and on an opposite side thereof, a semiconductor distributed Bragg reflector, and comprising a resonator part made up of a semiconductor sandwiched by the dielectric distributed Bragg reflector and the semiconductor distributed Bragg reflector, wherein relative to a lasing wavelength $\lambda_0$ of said surface-emission type semiconductor laser, an optical path length L of said resonator part made up of the semiconductor is selected such that $0.9 \times \lambda_0 \leq L \leq 1.1 \times \lambda_0$; and in relation to a light of lasing wavelength $\lambda_0$, when denoting:

a refraction index of a semiconductor making up a portion of said resonator part made up of the semiconductor, which portion is in contact with the semiconductor distributed Bragg reflector, by a symbol $n_{S2}$;

refraction indexes of a high refraction-index layer and a low refraction-index layer, which compose said semiconductor distributed Bragg reflector, respectively by symbols $n_{H2}$ and $n_{L2}$;

an average refraction index determined by averaging the refraction index regarding a semiconductor making up a portion of said resonator part made up of the semiconductor, which portion is in contact with the dielectric distributed Bragg reflector, over a range where the optical path length measured from the contact interface is within ¼ of the lasing wavelength $\lambda_0$ by a symbol $n_{S1}$; and refraction indexes of a high refraction-index layer and a low refraction-index layer, which compose said dielectric distributed Bragg reflector, respectively by symbols $n_{H1}$ and $n_{L1}$, semiconductor materials composing the resonator part made up of the semiconductor, semiconductor materials making up the high refraction-index layer and the low refraction-index layer of the semiconductor distributed Bragg reflector, and dielectric materials making up the high refraction-index layer and the low refraction-index layer of the dielectric distributed Bragg reflector are selected such that $n_{S1}$, $n_{H1}$, and $n_{L1}$ satisfy the following condition defined by equation (1), and $n_{S2}$, $n_{H2}$, and $n_{L2}$ satisfy the following condition defined by equation (2):

$$n_{H1} > f(n_{S1})n_{L1}^2 + g(n_{S1})n_{L1} + h(n_{S1}) \qquad (1)$$

where $n_{S1} > n_{L1}$ and
$f(n_{S1}) = 0.0266\, n_{S1}^2 - 0.2407\, n_{S1} + 0.6347$
$g(n_{S1}) = -0.0508\, n_{S1}^2 + 0.4335\, n_{S1} - 0.0085$
$h(n_{S1}) = 0.0382\, n_{S1}^2 - 0.3194\, n_{S1} + 0.7398$ $$(n_{H2} - n_{L2}) > 0.4, \text{ where } n_{H2} > n_{L2} \text{ and } n_{S2} > n_{L2}. \qquad (2)$$

2. A surface-emission type semiconductor laser employing a dielectric distributed Bragg reflector and on an opposite side thereof, a semiconductor distributed Bragg reflector, and comprising a resonator part made up of a semiconductor sandwiched by said dielectric distributed Bragg reflector and the semiconductor distributed Bragg reflector,
wherein
relative to a lasing wavelength $\lambda_0$ of said surface-emission type semiconductor laser,
an optical path length L of said resonator part made up of the semiconductor is selected such that $1.4 \times \lambda_0 \leq L \leq 1.6 \times \lambda_0$, and
in relation to a light of lasing wavelength $\lambda_0$,
when denoting:
a refraction index of a semiconductor making up a portion of said resonator part made up of the semiconductor, which portion is in contact with the semiconductor distributed Bragg reflector by a symbol $n_{S2}$;
refraction indexes of a high refraction-index layer and a low refraction-index layer, which compose said semiconductor distributed Bragg reflector, respectively by symbols $n_{H2}$ and $n_{L2}$;
an average refraction index determined by averaging the refraction index regarding a semiconductor making up a portion of said resonator part made up of the semiconductor, which portion is in contact with the dielectric distributed Bragg reflector, over a range where the optical path length measured from the contact interface is within ¼ of the lasing wavelength $\lambda_0$ by a symbol $n_{S1}$; and
refraction indexes of a high refraction-index layer and a low refraction-index layer, which compose said dielectric distributed Bragg reflector, respectively by symbols $n_{H1}$ and $n_{L1}$,
semiconductor materials composing the resonator part made up of the semiconductor, semiconductor materials making up the high refraction-index layer and the low refraction-index layer of the semiconductor distributed Bragg reflector, and dielectric materials making up the high refraction-index layer and the low refraction-index layer of the dielectric distributed Bragg reflector are selected such that
$n_{S1}$, $n_{H1}$, and $n_{L1}$ satisfy the following condition defined by equation (3), and
$n_{S2}$, $n_{H2}$, and $n_{L2}$ satisfy the following condition defined by equation (4):

$$n_{H1} > f(n_{S1})n_{L1}^2 + g(n_{S1})n_{L1} + h(n_{S1}) \qquad (3)$$

where $n_{S1} > n_{L1}$ and
$f(n_{S1}) = 0.1553\, n_{S1}^2 - 1.2429\, n_{S1} + 2.7959$
$g(n_{S1}) = -0.2761\, n_{S1}^2 + 2.1387\, n_{S1} - 3.5292$
$h(n_{S1}) = 0.1593\, n_{S1}^2 - 1.2113\, n_{S1} + 2.5512$ $$(n_{H2} - n_{L2}) > 0.4, \text{ where } n_{H2} > n_{L2} \text{ and } n_{S2} > n_{L2}. \qquad (4)$$

3. The surface-emission type semiconductor laser according to claim 1,
wherein
the laser comprises the semiconductor Bragg reflector formed on a semiconductor substrate;
the semiconductor materials, which are used to compose the semiconductor materials making up the high refraction-index layer and the low refraction-index layer of said semiconductor distributed Bragg reflector, are semiconductor materials having n-type conductivity;
the semiconductor used to make up the portion of said resonator part made up of the semiconductor, which portion is in contact with the semiconductor distributed Bragg reflector, is a semiconductor material having n-type conductivity;
an emission region having a structure which is composed of an n-type clad layer, an active layer, and a p-type clad layer that are stacked up in series from the semiconductor substrate side is provided in said resonator part made up of the semiconductor;
a tunnel junction composed of a $p^+$ semiconductor layer/$n^+$ semiconductor layer is formed over said p-type clad layer;
a semiconductor used to make up the portion of said resonator part made up of the semiconductor, which portion is in contact with the dielectric distributed Bragg reflector, is a semiconductor material having n-type conductivity; and
said laser further comprises a first n-type electrode provided in the surface of the semiconductor that is used to make up the portion made up of the semiconductor material having n-type conductivity, which portion is in contact with the dielectric distributed Bragg reflector, and
a second n-type electrode that is electrically in contact with at least said n-type clad layer,
wherein
the emission region has such a structure in which
injection of holes from said p-type clad layer to said active layer is performed by applying a driving bias between said first n-type electrode and second n-type electrode so as to feed a tunnel current via the tunnel junction made up of said $p^+$ semiconductor layer and $n^+$ semiconductor layer.

4. The surface-emission type semiconductor laser according to claim 1,
wherein
the laser comprises the semiconductor Bragg reflector formed on a semiconductor substrate;
the semiconductor materials, which are used to compose the semiconductor materials making up the high refraction-index layer and the low refraction-index layer of said semiconductor distributed Bragg reflector, are semiconductor materials having p-type conductivity;
the semiconductor used to make up the portion of said resonator part made up of the semiconductor, which portion is in contact with the semiconductor distributed Bragg reflector, is a semiconductor material having p-type conductivity;
an emission region having a structure which is composed of a p-type clad layer, an active layer, and an n-type clad layer that are stacked up in series from the semiconductor substrate side is provided in said resonator part made up of the semiconductor;
a semiconductor used to make up the portion of said resonator part made up of the semiconductor, which portion is in contact with the dielectric distributed Bragg reflector, is a semiconductor material having n-type conductivity; and said laser further comprises an n-type electrode provided in the surface of the semiconductor that is used to make up the portion made up of the semiconductor material having n-type conductivity, which portion is in contact with the dielectric distributed Bragg reflector, and a p-type electrode that is electrically in contact with at least said p-type clad layer, wherein the emission region has such a structure in which injection of holes from said p-type clad layer to said active layer is performed by applying a driving bias between said n-type electrode and p-type electrode so as to feed a forward direction current therebetween.

5. The surface-emission type semiconductor laser according to claim 2, wherein in a region included in said resonator part made up of the semiconductor, which region is in contact with the semiconductor distributed Bragg reflector, there is provided an emission region that is composed of an n-type clad layer, an active layer, and a p-type clad layer; and in a region included in said resonator part made up of the semiconductor, which region is placed between said emission region and the dielectric distributed Bragg reflector, there are provided at least two semiconductor layers each having an optical path length of about ¼ of the lasing wavelength $\lambda_0$, which layers are made up of two kinds of semiconductor materials each having a different refraction index.

6. The surface-emission type semiconductor laser according to claim 1, wherein said light-emitting face is provided on the upper face side of the semiconductor substrate;

the semiconductor distributed Bragg reflector on the opposite face side is formed on said semiconductor substrate;

said semiconductor substrate is a GaAs substrate; and the semiconductor distributed Bragg reflector formed on said semiconductor substrate is made up of at least a layer made of GaAs, and a layer containing Al, Ga and As.

7. The surface-emission type semiconductor laser according to claim 2, wherein the laser comprises the semiconductor Bragg reflector formed on a semiconductor substrate;

the semiconductor materials, which are used to compose the semiconductor materials making up the high refraction-index layer and the low refraction-index layer of said semiconductor distributed Bragg reflector, are semiconductor materials having n-type conductivity;

the semiconductor used to make up the portion of said resonator part made up of the semiconductor, which portion is in contact with the semiconductor distributed Bragg reflector, is a semiconductor material having n-type conductivity;

an emission region having a structure which is composed of an n-type clad layer, an active layer, and a p-type clad layer that are stacked up in series from the semiconductor substrate side is provided in said resonator part made up of the semiconductor;

a tunnel junction composed of a p$^+$ semiconductor layer/n$^+$ semiconductor layer is formed over said p-type clad layer;

a semiconductor used to make up the portion of said resonator part made up of the semiconductor, which portion is in contact with the dielectric distributed Bragg reflector, is a semiconductor material having n-type conductivity; and said laser further comprises a first n-type electrode provided in the surface of the semiconductor that is used to make up the portion made up of the semiconductor material having n-type conductivity, which portion is in contact with the dielectric distributed Bragg reflector, and a second n-type electrode that is electrically in contact with at least said n-type clad layer, wherein the emission region has such a structure in which injection of holes from said p-type clad layer to said active layer is performed by applying a driving bias between said first n-type electrode and second n-type electrode so as to feed a tunnel current via the tunnel junction made up of said p$^+$ semiconductor layer and n$^+$ semiconductor layer.

8. The surface-emission type semiconductor laser according to claim 2, wherein the laser comprises the semiconductor Bragg reflector formed on a semiconductor substrate;

the semiconductor materials, which are used to compose the semiconductor materials making up the high refraction-index layer and the low refraction-index layer of said semiconductor distributed Bragg reflector, are semiconductor materials having p-type conductivity;

the semiconductor used to make up the portion of said resonator part made up of the semiconductor, which portion is in contact with the semiconductor distributed Bragg reflector, is a semiconductor material having p-type conductivity;

an emission region having a structure which is composed of a p-type clad layer, an active layer, and an n-type clad layer that are stacked up in series from the semiconductor substrate side is provided in said resonator part made up of the semiconductor;

a semiconductor used to make up the portion of said resonator part made up of the semiconductor, which portion is in contact with the dielectric distributed Bragg reflector, is a semiconductor material having n-type conductivity; and said laser further comprises an n-type electrode provided in the surface of the semiconductor that is used to make up the portion made up of the semiconductor material having n-type conductivity, which portion is in contact with the dielectric distributed Bragg reflector, and a p-type electrode that is electrically in contact with at least said p-type clad layer, wherein the emission region has such a structure in which injection of holes from said p-type clad layer to said active layer is performed by applying a driving bias between said n-type electrode and p-type electrode so as to feed a forward direction current therebetween.

9. The surface-emission type semiconductor laser according to claim 2, wherein said light-emitting face is provided on the upper face side of the semiconductor substrate;

the semiconductor distributed Bragg reflector on the opposite face side is formed on said semiconductor substrate;

said semiconductor substrate is a GaAs substrate; and the semiconductor distributed Bragg reflector formed on said semiconductor substrate is made up of at least a layer made of GaAs, and a layer containing Al, Ga and As.

10. The surface-emission type semiconductor laser according to claim 3,
wherein
said light-emitting face is provided on the upper face side of the semiconductor substrate;
the semiconductor distributed Bragg reflector on the opposite face side is formed on said semiconductor substrate;
said semiconductor substrate is a GaAs substrate; and
the semiconductor distributed Bragg reflector formed on said semiconductor substrate is made up of at least a layer made of GaAs, and a layer containing Al, Ga and As.

11. The surface-emission type semiconductor laser according to claim 4,
wherein
said light-emitting face is provided on the upper face side of the semiconductor substrate;
the semiconductor distributed Bragg reflector on the opposite face side is formed on said semiconductor substrate;
said semiconductor substrate is a GaAs substrate; and
the semiconductor distributed Bragg reflector formed on said semiconductor substrate is made up of at least a layer made of GaAs, and a layer containing Al, Ga and As.

12. The surface-emission type semiconductor laser according to claim 5,
wherein
said light-emitting face is provided on the upper face side of the semiconductor substrate;
the semiconductor distributed Bragg reflector on the opposite face side is formed on said semiconductor substrate;
said semiconductor substrate is a GaAs substrate; and
the semiconductor distributed Bragg reflector formed on said semiconductor substrate is made up of at least a layer made of GaAs, and a layer containing Al, Ga and As.

13. The surface-emission type semiconductor laser according to claim 7,
wherein
said light-emitting face is provided on the upper face side of the semiconductor substrate;
the semiconductor distributed Bragg reflector on the opposite face side is formed on said semiconductor substrate;
said semiconductor substrate is a GaAs substrate; and
the semiconductor distributed Bragg reflector formed on said semiconductor substrate is made up of at least a layer made of GaAs, and a layer containing Al, Ga and As.

14. The surface-emission type semiconductor laser according to claim 8,
wherein
said light-emitting face is provided on the upper face side of the semiconductor substrate;
the semiconductor distributed Bragg reflector on the opposite face side is formed on said semiconductor substrate;
said semiconductor substrate is a GaAs substrate; and
the semiconductor distributed Bragg reflector formed on said semiconductor substrate is made up of at least a layer made of GaAs, and a layer containing Al, Ga and As.

15. The surface-emission type semiconductor laser according to claim 1,
wherein
in a region included in said resonator part made up of the semiconductor, which region is in contact with the semiconductor distributed Bragg reflector,
there is provided an emission region that is composed of an n-type clad layer, an active layer, and a p-type clad layer; and
an optical path length: $L_2$ from the center of the active layer to the top face of the semiconductor distributed Bragg reflector is set about ½ of the lasing wavelength $\lambda_0$.

16. The surface-emission type semiconductor laser according to claim 2,
wherein
in a region included in said resonator part made up of the semiconductor, which region is in contact with the semiconductor distributed Bragg reflector,
there is provided an emission region that is composed of an n-type clad layer, an active layer, and a p-type clad layer; and
an optical path length: $L_2$ from the center of the active layer to the top face of the semiconductor distributed Bragg reflector is set about ½ of the lasing wavelength $\lambda_0$.

* * * * *